(12) United States Patent
Arai et al.

(10) Patent No.: US 10,904,963 B2
(45) Date of Patent: Jan. 26, 2021

(54) OPTICAL DEVICE

(71) Applicant: PIONEER CORPORATION, Tokyo (JP)

(72) Inventors: Kazuaki Arai, Kawagoe (JP); Shinichi Ishizuka, Kawagoe (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 16/479,169

(22) PCT Filed: Jan. 17, 2018

(86) PCT No.: PCT/JP2018/001190
§ 371 (c)(1),
(2) Date: Jul. 18, 2019

(87) PCT Pub. No.: WO2018/135525
PCT Pub. Date: Jul. 26, 2018

(65) Prior Publication Data
US 2019/0394842 A1    Dec. 26, 2019

(30) Foreign Application Priority Data

Jan. 18, 2017   (JP) ................................ 2017-006774

(51) Int. Cl.
*H05B 33/02* (2006.01)
*G02B 5/08* (2006.01)
(Continued)

(52) U.S. Cl.
CPC .............. *H05B 33/02* (2013.01); *G02B 5/08* (2013.01); *H01L 27/146* (2013.01); *H01L 27/15* (2013.01);
(Continued)

(58) Field of Classification Search
None
See application file for complete search history.

(56) References Cited

U.S. PATENT DOCUMENTS 5,559,400 A    9/1996  Nakayama et al.
5,780,174 A    7/1998  Tokito et al.
(Continued)

FOREIGN PATENT DOCUMENTS

JP    H05-191563 A    7/1993
JP    H07-142171 A    6/1995
(Continued)

OTHER PUBLICATIONS

Tsutsui, T. et al., Sharply directed emission in organic electroluminescent diodes with an optical-microcavity structure Appl. Phys. Lett, Oct. 10, 1994, vol. 65, iss. 15; pp. 1868-1870 (3 pages).
(Continued)

*Primary Examiner* — Ashok Patel
(74) *Attorney, Agent, or Firm* — Procopio, Cory, Hargreaves & Savitch LLP

(57) ABSTRACT

An optical device includes a light emitting device and a sensor device (light receiving element). The light emitting device includes a substrate, a plurality of light emitting elements, and a plurality of light transmission portions. The substrate has a first surface and a second surface. The second surface is opposite to the first surface. The plurality of light emitting elements is positioned at the first surface side of the substrate. Each of the plurality of light transmission portions is positioned between adjacent light emitting elements. The light emitting device is light-transmissive by the plurality of light transmission portions. Light from the plurality of light emitting elements is mainly output from the second surface of the substrate. An amount of light emitted from each of the (Continued)

light emitting elements and leaked to the outside of the first surface of the substrate is reduced.

15 Claims, 15 Drawing Sheets

(51) Int. Cl.
    *H01L 27/146*     (2006.01)
    *H01L 51/50*     (2006.01)
    *H01L 51/52*     (2006.01)
    *H05B 33/24*     (2006.01)
    *H05B 33/26*     (2006.01)
    *H01L 27/15*     (2006.01)

(52) U.S. Cl.
    CPC ...... *H01L 51/5012* (2013.01); *H01L 51/5265* (2013.01); *H05B 33/24* (2013.01); *H05B 33/26* (2013.01); *H01L 2251/53* (2013.01)

(56) References Cited

U.S. PATENT DOCUMENTS

| | | |
|---|---|---|
| 7,245,065 B2 | 7/2007 | Ghosh et al. |
| 8,963,414 B2 | 2/2015 | Sawabe et al. |
| 9,076,741 B2 | 7/2015 | Watanabe et al. |
| 2004/0263045 A1* | 12/2004 | Smith ................. H01L 27/3211 313/373 |
| 2005/0083323 A1* | 4/2005 | Suzuki ................. G09G 3/3233 345/207 |
| 2006/0220509 A1 | 10/2006 | Ghosh et al. |
| 2013/0182418 A1 | 7/2013 | Sawabe et al. |
| 2014/0375743 A1 | 12/2014 | Watanabe et al. |
| 2019/0036081 A1 | 1/2019 | Osawa et al. |

FOREIGN PATENT DOCUMENTS

| | | |
|---|---|---|
| JP | H09-180883 A | 7/1997 |
| JP | 2000-357815 A | 12/2000 |
| JP | 2013-149376 A | 8/2013 |
| JP | 2015-005545 A | 1/2015 |
| JP | 2015-195173 A | 11/2015 |
| WO | 2017/122386 A1 | 7/2017 |

OTHER PUBLICATIONS

International Search Report for related International Application No. PCT/JP2018/001190, dated Apr. 10, 2018 (2 pages).

\* cited by examiner

OPTICAL DEVICE

CROSS-REFERENCE TO RELATED APPLICATIONS

This application is a U.S. National Stage entry of PCT Application No. PCT/JP2018/001190 filed Jan. 17, 2018, which claims priority to Japanese Patent Application No. 2017-006774, filed Jan. 18, 2017, the contents of which are incorporated herein by reference.

TECHNICAL FIELD

The present invention relates to an optical device.

BACKGROUND ART

In recent years, a light-transmissive organic light emitting diode (OLED) has been developed as a light emitting device for lighting or display or for a display or the like. Patent Document 1 discloses an example of a light-transmissive OLED. The OLED includes a substrate, a first electrode, an organic layer, and a plurality of second electrodes. The first electrode and the organic layer are laminated on the substrate in order. The plurality of second electrodes is arranged on the organic layer in a stripe shape. Light from the outside of the OLED can be transmitted through a region on the substrate, such as between adjacent first electrodes, for example. Thus, the OLED is light-transmissive.

Patent Document 2 discloses that the light-transmissive OLED is attached to a rear window of an automobile. This light-transmissive OLED can function as a sign lamp of the automobile, such as a high-mounted stop lamp, for example.

RELATED DOCUMENT

Patent Document

[Patent Document 1] Japanese Unexamined Patent Application Publication No. 2013-149376
[Patent Document 2] Japanese Unexamined Patent Application Publication No. 2015-195173

SUMMARY OF THE INVENTION

Technical Problem

As described above, in recent years, the light-transmissive OLED has been developed as a light emitting device. In a certain application (for example, tail lamp of an automobile), this light emitting device may be used together with a device including a light receiving element (for example, a photodiode (PD)) (for example, an optical sensor or an imaging device). In this case, it is necessary to reduce, as much as possible, erroneous detection of the light receiving element due to light emitted from the light emitting device.

An example of the problem to be solved by the present invention is to reduce erroneous detection of a light receiving element due to light emitted from a light emitting device.

Solution to Problem

The invention described in claim 1 is an optical device including: a substrate including a first surface and a second surface opposite to the first surface;
a plurality of light emitting elements positioned at the first surface side of the substrate, each of the light emitting elements including a first electrode, an organic layer, and a second electrode;
a plurality of light transmission portions each positioned between adjacent light emitting elements; and
a light receiving element,
in which a medium having a refractive index lower than that of the substrate is positioned at the second surface side of the substrate, and
light distribution of each of the light emitting elements has luminous intensity in a critical-angle direction of the substrate and the medium that is equal to or less than 0.36 times luminous intensity in a direction perpendicular to the substrate.

The invention described in claim 7 is an optical device including:
a substrate including a first surface and a second surface opposite to the first surface;
a plurality of light emitting elements positioned at the first surface side of the substrate, each of the light emitting elements including a first electrode, an organic layer, and a second electrode having a light shielding property;
a plurality of light transmission portions each positioned between adjacent light emitting elements; and
a light receiving element,
in which the second surface of the substrate is positioned at a side of a medium having a refractive index lower than that of the substrate, and
light distribution at the second surface side has luminous intensity in a direction perpendicular to the second surface that is less than luminous intensity in a direction inclined from a direction perpendicular to the second surface.

The invention described in claim 8 is an optical device including:
a substrate including a first surface and a second surface opposite to the first surface;
a plurality of light emitting elements positioned at the first surface side of the substrate, each of the light emitting elements including a first electrode, an organic layer, and a second electrode having a light shielding property;
a plurality of light transmission portions each positioned between adjacent light emitting elements; and
a light receiving element,
wherein a directivity half-value angle of light emission of each of the light emitting elements is equal to or less than 66 degrees.

BRIEF DESCRIPTION OF THE DRAWINGS

The above object and other objects, features, and advantages will become more apparent from the following descriptions of the preferred embodiments and the accompanying drawings.

DESCRIPTION OF EMBODIMENTS

Hereinafter, embodiments of the present invention will be described with reference to the drawings. In all drawings, the same constituent components are denoted by the same reference signs, and descriptions will not be repeated.

Embodiment 1

Figure 1:
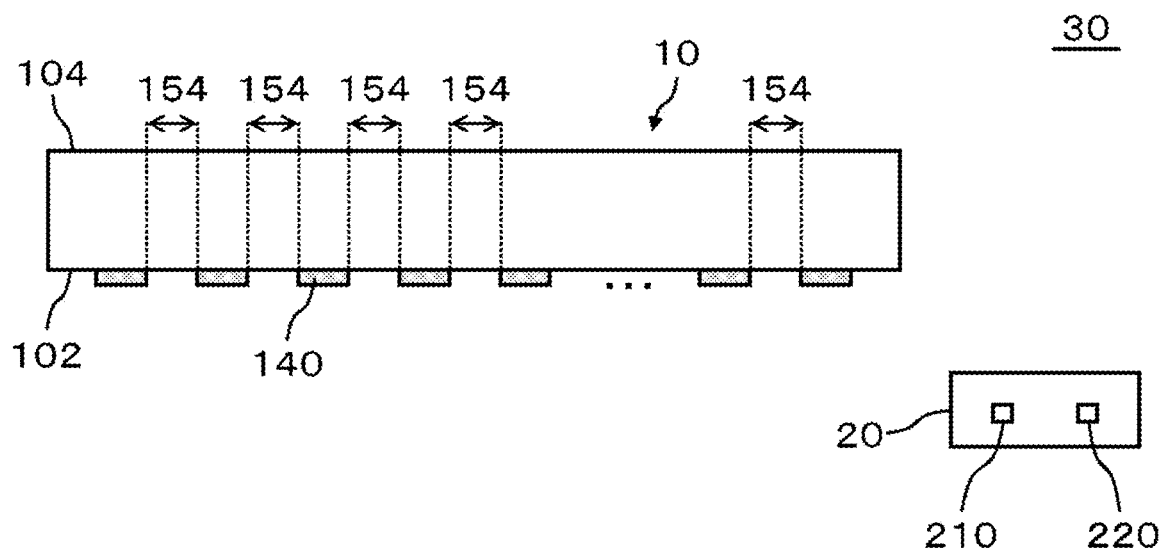
FIG. 1 is a diagram for explaining an optical device according to Embodiment 1.

FIG. 1 is a diagram illustrating an optical device 30 according to Embodiment 1.

The optical device 30 includes a light emitting device 10 and a sensor device 20 (light receiving element 220).

The light emitting device 10 includes a substrate 100, a plurality of light emitting elements 140, and a plurality of light transmission portions 154. The substrate 100 has a first surface 102 and a second surface 104. The second surface 104 is opposite to the first surface 102. The plurality of light emitting elements 140 is positioned at the first surface 102 side of the substrate 100. Each of the plurality of light transmission portions 154 is positioned between adjacent light emitting elements 140. The light emitting device 10 is light-transmissive by the plurality of light transmission portions 154.

The light emitting device 10 illustrated in FIG. 1 has a configuration similar to that of a light emitting device 10 which will be described in detail with reference to the drawings from FIG. 3 onward.

As will be described in detail with reference to the drawings subsequent to FIG. 3, light from the plurality of light emitting elements 140 is mainly output from the second surface 104 of the substrate 100. Particularly in the embodiment, the amount of light emitted from each of the light emitting elements 140 and leaked from the first surface 102 side of the substrate 100 is reduced.

The sensor device 20 is provided around the light emitting device 10. In the example illustrated in FIG. 1, the sensor device 20 is diagonally in front of the first surface 102 of the substrate 100, specifically, is positioned at a position that is at the first surface 102 side as viewed from a direction parallel to the substrate 100 and that does not overlap the first surface 102 or the second surface 104 as viewed from a direction perpendicular to the substrate 100. In another example, the sensor device 20 may be in front of the first surface 102 of the substrate 100 or may be at a side between the first surface 102 and the second surface 104 of the substrate 100. In still another example, the sensor device 20 may be diagonally in front of the second surface 104 of the substrate 100. Specifically, the sensor device 20 may be positioned at a position that is at the second surface 104 side of the substrate 100 as viewed from the direction parallel to the substrate 100 and that does not overlap the first surface 102 or the second surface 104 as viewed from the direction perpendicular to the substrate 100.

The sensor device 20 performs optical sensing for acquiring information of the surrounding of the optical device 30. In the example illustrated in FIG. 1, the sensor device 20 includes a light emitting element 210 and a light receiving element 220. In one example, the sensor device 20 may be a range sensor, especially Light Detection And Ranging (LiDAR). In this example, the light emitting element 210 emits light to the outside of the sensor device 20. The light receiving element 220 receives light emitted from the light emitting element 210 and then reflected by an object. In one example, the light emitting element 210 may be an element capable of converting electrical energy into light energy, such as a laser diode (LD), for example. The light receiving element 220 may be an element capable of converting light energy into electrical energy, such as a photodiode (PD), for example. The sensor device 20 can detect a distance from the sensor device 20 to an object, based on time from when light is emitted from the light emitting element 210 until the light is received by the light receiving element 220.

The light receiving element 220 of the sensor device 20 detects light from the outside of the sensor device 20. Thus, in order to prevent erroneous detection of the light receiving element 220, it is desirable to reduce, as much as possible, incidence of light emitted from the light emitting device 10 to the light receiving element 220.

The optical device 30 may be used for use for light emission and optical sensing, such as a tail lamp with a range sensor, of an automobile, for example. In this example, the light emitting device 10 realizes a function of light emission. The sensor device 20 realizes a function of optical sensing.

According to the above-described configuration, it is possible to reduce erroneous detection of the light receiving element 220 due to light emitted from the light emitting device 10. Specifically, as described above, in the embodiment, the amount of light emitted from each of the light emitting elements 140 and leaked from the first surface 102 side of the substrate 100 is reduced. Thus, it is possible to reduce incidence of light emitted from the light emitting device 10 to the device 20 (light receiving element 220). Accordingly, it is possible to reduce erroneous detection of the light receiving element 220 due to light emitted from the light emitting device 10.

Particularly in the embodiment, it is possible to reduce erroneous detection of the light receiving element 220 due to light emitted from the light emitting device 10 even if the device 20 (light receiving element 220) is in front of or diagonally in front of the first surface 102 of the substrate 100. As described above, in the embodiment, the amount of light emitted from each of the light emitting elements 140 and leaked from the first surface 102 side of the substrate 100 is reduced. Thus, it is possible to reduce leakage of light emitted from the light emitting device 10 to the front or the diagonal front of the first surface 102 of the substrate 100. Accordingly, it is possible to reduce erroneous detection of the light receiving element 220 due to light emitted from the light emitting device 10 even if the device 20 (light receiving element 220) is in front of or diagonally in front of the first surface 102 of the substrate 100.

Embodiment 2

Figure 2:
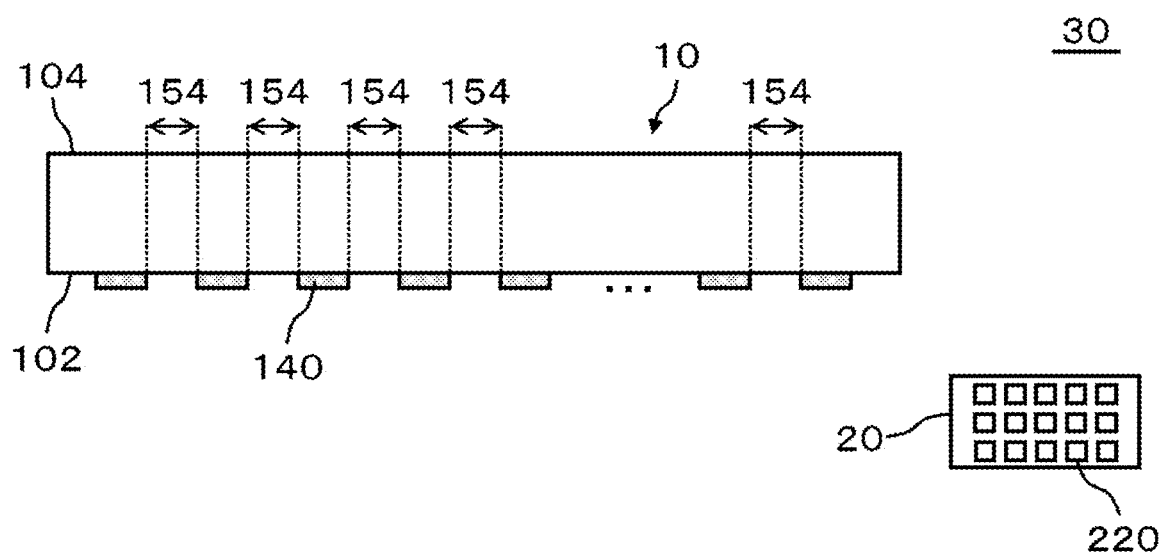
FIG. 2 is a diagram for explaining an optical device according to Embodiment 2.

FIG. 2 is a diagram illustrating an optical device 30 according to Embodiment 2 and corresponds to FIG. 1 in Embodiment 1. The optical device 30 according to this embodiment is similar to the optical device 30 according to Embodiment 1 except for the following points.

The sensor device 20 performs optical sensing for acquiring information of the surrounding of the optical device 30. In the example illustrated in FIG. 2, the sensor device 20 includes a plurality of light receiving element 220. In one example, the sensor device 20 may be an imaging sensor. In this example, the plurality of light receiving elements 220 may be elements capable of converting an image into an electrical signal, such as a charge-coupled device (CCD) image sensor or a complementary metal-oxide-semiconductor (CMOS) image sensor, for example. In one example, each of the light receiving elements 220 may be an element capable of converting light energy into electrical energy, such as a photodiode (PD), for example. The sensor device 20 can detect an image of an object on the outside of the sensor device 20 by the plurality of light receiving elements 220.

The light receiving element 220 of the sensor device 20 detects light from the outside of the sensor device 20. Thus, in order to prevent erroneous detection of the light receiving element 220, it is desirable to reduce, as much as possible, the amount of light emitted from the light emitting device 10 and incident to the light receiving element 220.

The optical device 30 may be used for use for light emission and optical sensing, such as a tail lamp with an imaging sensor, of an automobile, for example. In this example, the light emitting device 10 realizes a function of light emission. The sensor device 20 realizes a function of optical sensing.

In the embodiment, in a manner similar to that in Embodiment 1, it is possible to reduce erroneous detection of the light receiving element 220 due to light emitted from the light emitting device 10.

Embodiment 3

Figure 3:
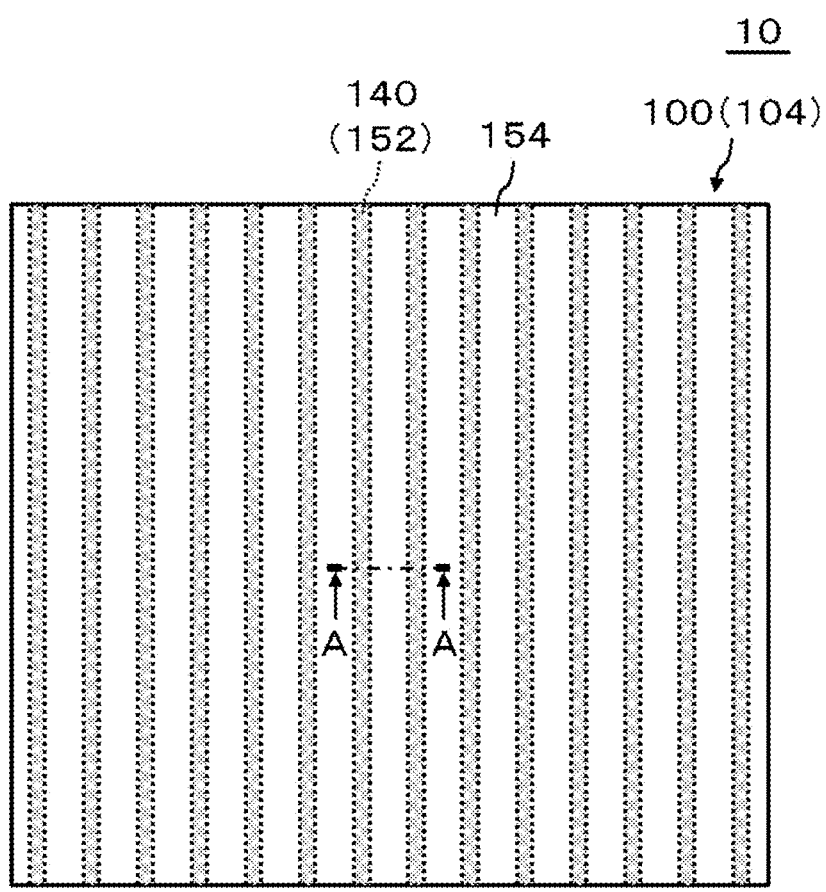
FIG. 3 is a plan view illustrating a light emitting device according to Embodiment 3.
Figure 4:
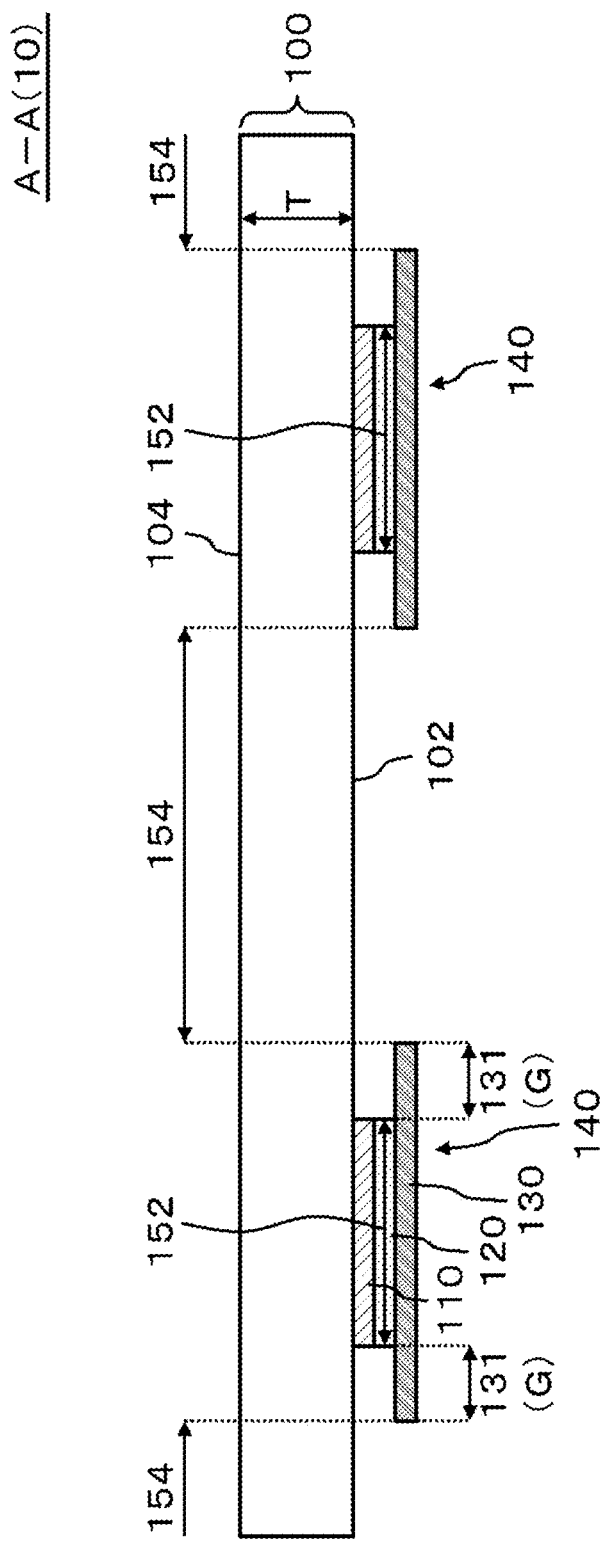
FIG. 4 is a sectional view taken along line A-A in FIG. 3.

FIG. 3 is a plan view illustrating a light emitting device 10 according to Embodiment 3. FIG. 4 is a sectional view taken along line A-A in FIG. 3.

The outline of the light emitting device 10 will be described with reference to FIG. 4. The light emitting device 10 includes a substrate 100, a plurality of light emitting elements 140, and a plurality of light transmission portions 154. The substrate 100 has a first surface 102 and a second surface 104. The second surface 104 is opposite to the first surface 102. The plurality of light emitting elements 140 is positioned at the first surface 102 side of the substrate 100. Each of the plurality of light emitting elements 140 includes a first electrode 110, an organic layer 120, and a second electrode 130. The second electrode 130 has a light shielding property. Each of the plurality of light transmission portions 154 is positioned between adjacent light emitting elements 140. A medium having a refractive index lower than that of the substrate 100 (for example, air) is positioned at the second surface 104 side of the substrate 100. Particularly in the example illustrated in FIG. 4, the second surface 104 of the substrate 100 is in contact with the medium. The second surface 104 of the substrate 100 may not be in contact with the medium. A region different from the substrate 100 and the medium (for example, light extraction film) may be positioned between the second surface 104 of the substrate 100 and the above-described medium.

The inventors have found that it is possible to reduce the amount of light leaked to the opposite side of the light-emitting surface of the light emitting device 10 (the second surface 104 of the substrate 100) by adjusting the light distribution of each of the light emitting elements 140. Specifically, as will be described later with reference to FIG. 5, reflectance of light incident from a high-refractive-index medium (glass in the example illustrated in FIG. 5) to a low-refractive-index medium (air in the example illustrated in FIG. 5) rapidly increases in the vicinity of the critical angle (about 41° in the example illustrated in FIG. 5) of the high-refractive-index medium and the low-refractive-index medium by Fresnel reflection. The inventors have found that light leaked to the opposite side of the light emitting surface of the light emitting device 10 (the second surface 104 of the substrate 100) is mainly caused by light reflected at an interface between the substrate 100 (corresponding to the above-described high-refractive-index medium) and the medium (corresponding to the above-described low-refractive-index medium) by Fresnel reflection. Further, as will be described later with reference to FIGS. 8 to 13, the inventors have found that by adjusting luminous intensity in front of the light emitting element 140 (front luminous intensity lf) and luminous intensity in a critical-angle direction of the substrate 100 and the medium (critical-angle luminous intensity lc) regarding light distribution of each of the light emitting elements 140, the less luminous intensity ratio Rc of the critical-angle luminous intensity lc to the front luminous intensity lf can reduce the amount of light leaked to the opposite side of the light-emitting surface (the second surface 104). Based on these findings, the amount of light leaked to the opposite side of the light-emitting surface (the second surface 104) can be reduced to a certain value or less.

The critical angle of the substrate 100 and the medium may be determined not only when the substrate 100 is in contact with the medium, but also when another region is provided between the substrate 100 and the medium. Particularly when the another region is provided between the substrate 100 and the medium, the above-described critical angle may be determined based on Snell's law, only by the refractive index of the substrate 100 and the refractive index of the medium without considering the refractive index of this another region. That is, the second surface 104 of the substrate 100 may or may not be in contact with the medium. Descriptions will be made below on the assumption that the second surface 104 of the substrate 100 is in contact with the medium.

The light distribution of each of the light emitting elements 140 means light distribution in the substrate 100. As will be described in detail with reference to the drawings subsequent to FIGS. 15 and 16, the light distribution in the substrate 100 may be measured by using a base material B.

Next, details of a planar layout of the light emitting device 10 will be described with reference to FIG. 3. In FIG. 3, the light emitting device 10 is viewed from side of the light-emitting surface of the light emitting device 10 (the second surface 104 of the substrate 100). The light emitting device 10 includes the substrate 100, a plurality of light emitting portions 152, and the plurality of light transmission portions 154.

In the example illustrated in FIG. 3, the shape of the substrate 100 is rectangular. The shape of the substrate 100 is not limited to a rectangle and may be a polygon other than the rectangle, for example.

The plurality of light emitting elements 140 (light emitting portions 152) and the plurality of light transmission portions 154 are alternately arrayed and arranged in a stripe shape. Each of the light emitting elements 140 (light emitting portions 152) and each of the light transmission portions 154 extend along one pair of sides of the substrate 100. The plurality of light emitting elements 140 (light emitting portions 152) and the plurality of light transmission portions 154 are arranged along the other pair of sides of the substrate 100.

Next, details of a sectional structure of the light emitting device 10 will be described with reference to FIG. 4. The light emitting device 10 includes a substrate 100, a plurality of light emitting elements 140, and a plurality of light transmission portions 154.

The substrate 100 is light-transmissive. Therefore, light from each of the light emitting elements 140 can be transmitted through the substrate 100. Further, light from the outside of the light emitting device 10 can also be transmitted through the substrate 100. In particular, the substrate 100 can function as the light transmission portion 154 in a region that is not covered by a light shielding member (for example, second electrode 130). The light from the outside of the light emitting device 10 can be transmitted through the light transmission portions 154.

The substrate 100 has a first surface 102 and a second surface 104. The second surface 104 is opposite to the first surface 102. The second surface 104 functions as the light-emitting surface of the light emitting device 10. Specifically, light from the plurality of light emitting elements 140 is mainly output from the second surface 104.

The plurality of light emitting elements 140 is positioned at the first surface 102 of the substrate 100. Each of the light emitting elements 140 includes a first electrode 110, an organic layer 120, and a second electrode 130. The first electrode 110, the organic layer 120, and the second electrode 130 are laminated from the first surface 102 of the substrate 100 in order.

The first electrode 110 is light-transmissive. Therefore, light emitted from the organic layer 120 can be transmitted through the first electrode 110, and thereby can be incident to the substrate 100.

The organic layer 120 includes a light emitting layer that emits light by organic electroluminescence. The light emitting layer of the organic layer 120 is capable of emitting light by a voltage between the first electrode 110 and the second electrode 130.

The second electrode 130 is positioned to face the first electrode 110. For example, when it has at least one of the light shielding property, light reflectivity, and light absorbency, light emitted from the organic layer 120 is not transmitted through the second electrode 130 but is reflected by the second electrode 130. When the second electrode 130 is light-transmissive, transmissivity of the entirety of the light emitting device 10 is improved. In the light emitting device 10, the light-transmissive property of the second electrode 130 may be different.

Each of the light emitting elements 140 includes the light emitting portion 152. The light emitting element 140 is capable of emitting light from the light emitting portion 152.

Each of the second electrodes 130 has two gap portions 131. One gap portion 131 is outside one end portion of the light emitting portion 152. The other gap portion 131 is outside the other end portion of the light emitting portion 152.

The light transmission portion 154 does not overlap the light shielding member, specifically, the second electrode 130. Therefore, the light from the outside of the light emitting device 10 can be transmitted through the light transmission portion 154. From a viewpoint of maintaining high light transmissivity, the width of the light transmission portion 154 is preferably wider than the width of the second electrode 130. The width of the light transmission portion 154 may be equal to or narrower than the width of the second electrode 130.

Figure 5:
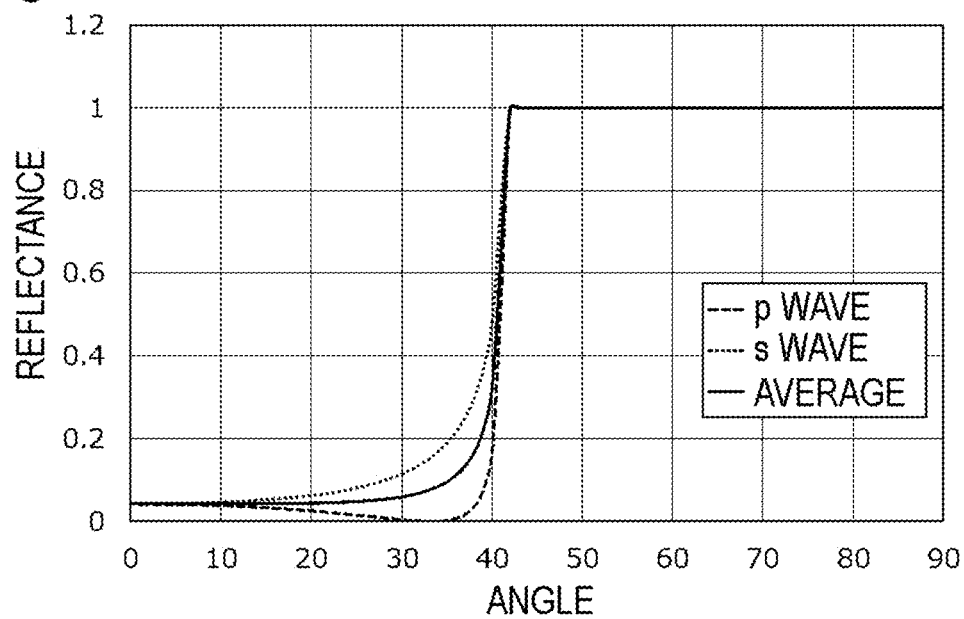
FIG. 5 is a graph illustrating reflectance of light incident from glass to an air.

FIG. 5 is a graph illustrating reflectance of light incident from glass to an air. FIG. 5 illustrates reflectance of a p wave, reflectance of an s wave, and their average reflectance. As illustrated in FIG. 5, all the reflectance of the p wave, the reflectance of the s wave, and their average reflectance increase rapidly in the vicinity of a critical angle (about 41°) between the glass and the air. This is caused by Fresnel reflection at an interface between the glass and the air.

From the result illustrated in FIG. 5, reflectance of light incident from the substrate 100 to the medium could also increase rapidly in the vicinity of the critical angle of the substrate 100 and the medium.

Figure 6:
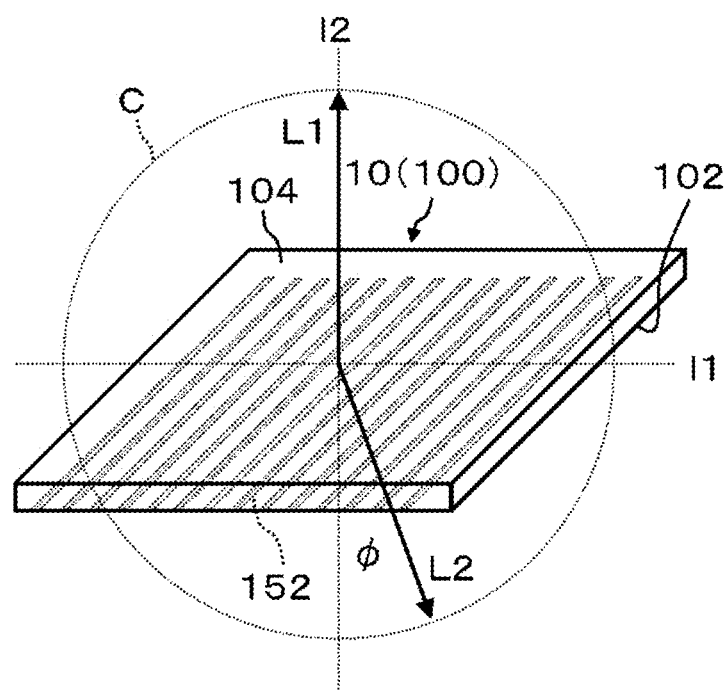
FIG. 6 is a diagram for explaining a direction of light leaked to an opposite side of a light-emitting surface of the light emitting device illustrated in FIGS. 3 and 4.

FIG. 6 is a diagram for explaining a direction of light leaked to the opposite side of the light-emitting surface of the light emitting device 10 (the second surface 104 of the substrate 100) illustrated in FIGS. 3 and 4. In the example illustrated in FIG. 6, light from the plurality of light emitting portions 152 is emitted, and light distribution is generated at each of the first surface 102 side of the substrate 100 and the second surface 104 side of the substrate 100.

The light distribution at the second surface 104 side of the substrate 100 (light-emitting surface of the light emitting device 10) has first luminous intensity L1 in the direction perpendicular to the second surface 104. The light distribution at the first surface 102 side of the substrate 100 (surface of the light emitting device 10 opposite to the light-emitting surface) has second luminous intensity L2 in a direction inclined from the direction perpendicular to the first surface 102 by an angle φ along an array direction of the plurality of light emitting elements 140 (plurality of light emitting portions 152). Particularly in the example illustrated in FIG. 6, the second luminous intensity L2 is luminous intensity on the circumference of a circle C including two straight lines 11 and 12. The straight line 11 is a straight line passing through the center of the substrate 100 in the array direction of the plurality of light emitting portions 152.

The straight line 12 is a straight line passing through the center of the substrate 100 in a normal direction of the substrate 100.

Next, measurement results of the light emitting device 10 illustrated in FIGS. 3 and 4 will be described.

The substrate 100 was a glass substrate (refractive index: 1.52). The thickness T of the substrate 100 was 0.1 mm. The shape of the substrate 100 was a rectangle of 9 mm×10 mm. The second surface 104 of the substrate 100 was in contact with the air (refractive index: 1). Fourteen light emitting elements 140 were arrayed at an equal interval along the long side (side having a length of 10 mm) of the substrate 100.

The width of each of the light emitting portions 152 was 0.2 mm. The center-to-center distance between the adjacent light emitting portions 152 (in other words, pitch between the light emitting portions 152) was 0.714 mm. The width of the second electrode 130 was 0.27 mm. In other words, the width G of the gap portion 131 was 0.035 mm.

The thickness of the organic layer 120 was 0.0001 mm. The thickness of the second electrode 130 was 0.0001 mm. In this measurement, the first electrode 110 was not considered. In other words, the thickness of the first electrode 110 was regarded to be zero.

Figure 7:
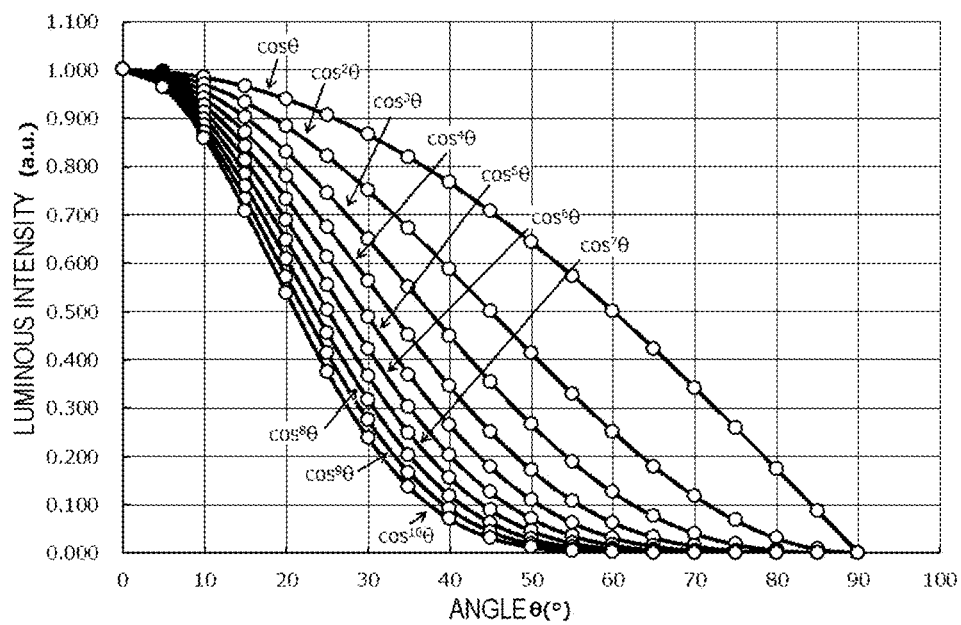
FIG. 7 is a diagram for explaining light distribution of each light emitting element used in simulation.

FIG. 7 is a diagram for explaining light distribution of each of the light emitting elements 140 used in simulation. In the simulation, 10 types of light emitting elements 140 were used, that is, a light emitting element 140 having light distribution following $\cos \theta$, a light emitting element 140 having light distribution following $\cos^2 \theta$, a light emitting element 140 having light distribution following $\cos^3 \theta$, a light emitting element 140 having light distribution following $\cos^4 \theta$, a light emitting element 140 having light distribution following $\cos^5 \theta$, a light emitting element 140 having light distribution following $\cos^6 \theta$, a light emitting element 140 having light distribution following $\cos^7 \theta$, a light emitting element 140 having light distribution following $\cos^8 \theta$, a light emitting element 140 having light distribution following $\cos^9 \theta$, and a light emitting element 140 having light distribution following $\cos^{10} \theta$ were used.

As illustrated in FIG. 7, from $\cos \theta$ to $\cos^{10} \theta$, the peak of the light distribution in a front direction of the light emitting element 140 (angle $\theta=0°$) is sharpened. In other words, from $\cos \theta$ to $\cos^{10} \theta$, the luminous intensity ratio Rc of the critical-angle luminous intensity lc to the front luminous intensity if is reduced. The light emitting element 140 or the light emitting device 10 having light distribution like this $\cos \theta$ is referred to as a Lambertian light source. For $\cos \theta$, the directivity half-value angle (or simply half-value angle) is 120 degrees. The light distribution like $\cos^{10} \theta$ is a light source having high directivity (high-directivity light source). In this case, the light distribution has a peak of light emission intensity in a specific direction (direction perpendicular to the second surface 104 in FIG. 6). The directivity half-value angle of the light distribution is equal to or less than 50 degrees. For example, the half-value angle of the light emitting element 140 following $\cos^4 \theta$ is 66 degrees, and the directivity half-value angle is reduced with increasing the multiplier of $\cos \theta$.

Figure 8:
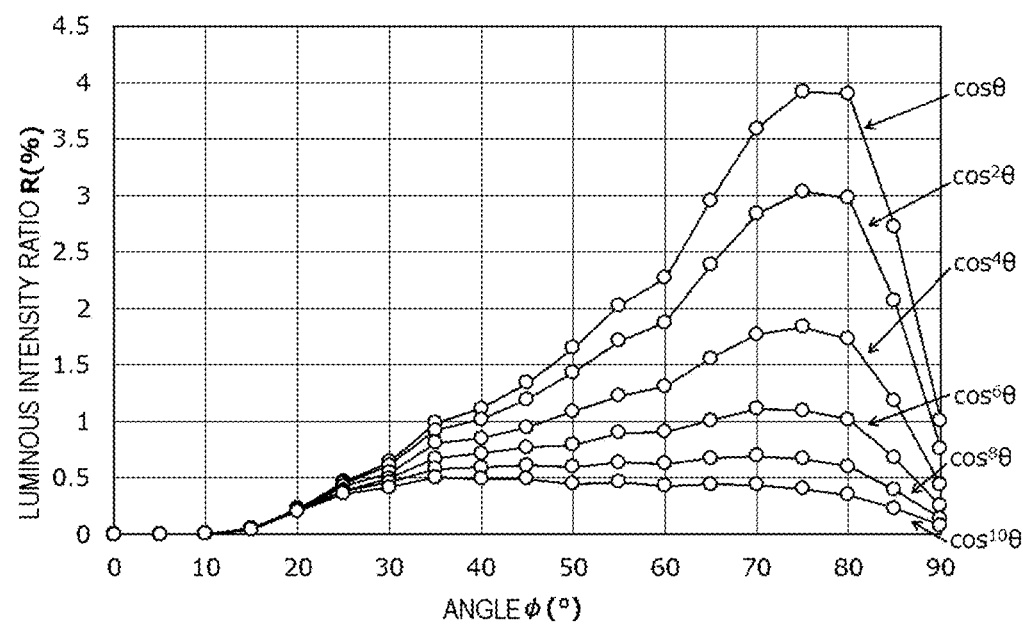
FIG. 8 is a diagram illustrating a first example of a simulation result of an amount of light leaked to the opposite side of the light-emitting surface of the light emitting device.

FIG. 8 is a diagram illustrating a first example of a simulation result of the amount of the light leaked to the opposite side of light-emitting surface of the light emitting device 10 (the second surface 104 of the substrate 100). In the simulation, the luminous intensity ratio R of each of the 10 types of light emitting elements 140 illustrated in FIG. 7 is calculated. For simple descriptions, FIG. 8 illustrates the luminous intensity ratios R of 6 types of light emitting elements 140, that is, the light emitting element 140 having light distribution following $\cos \theta$, the light emitting element 140 having light distribution following $\cos^2 \theta$, the light emitting element 140 having light distribution following $\cos^4 \theta$, the light emitting element 140 having light distribution following $\cos^6 \theta$, the light emitting element 140 having light distribution following $\cos^8 \theta$, and the light emitting element 140 having light distribution following $\cos^{10} \theta$. The luminous intensity ratio R is a luminous intensity ratio L2/L1 of the second luminous intensity L2 to the first luminous intensity L1. As described with reference to FIG. 6, the first luminous intensity L1 is luminous intensity in the direction perpendicular to the second surface 104. The second luminous intensity L2 is luminous intensity in the direction inclined from the direction perpendicular to the first surface 102 by an angle φ along the array direction of the plurality of light emitting elements 140 (plurality of light emitting portions 152).

As illustrated in FIG. 8, from $\cos \theta$ to $\cos^{10} \theta$, the luminous intensity ratio R decreases over the almost entire range of 0° to 90° for the angle φ. In other words, as the luminous intensity ratio Rc of the critical-angle luminous intensity lc to the front luminous intensity if is reduced, the amount of light leaked to the opposite side of the light-emitting surface of the light emitting device 10 (the second surface 104 of the substrate 100) decreases over the almost entire range of 0° to 90° for the angle cp. In the example illustrated in FIG. 8, the critical angle of the substrate 100 and the medium is 41.14°.

Figure 9:
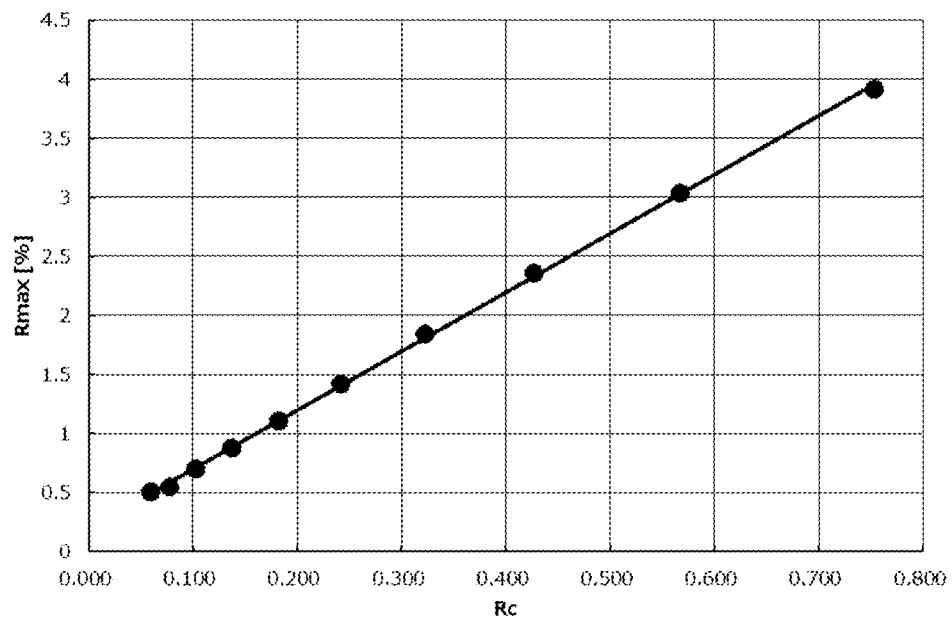
FIG. 9 is a graph illustrating a relation between a luminous intensity ratio of critical-angle luminous intensity to front luminous intensity and the maximum value of the luminous intensity ratio illustrated in FIG. 8.

FIG. 9 is a graph illustrating a relation between the luminous intensity ratio Rc of the critical-angle luminous intensity lc to the front luminous intensity if and the maximum value Rmax of the luminous intensity ratio R illustrated in FIG. 8. As illustrated in FIG. 9, the maximum luminous intensity ratio Rmax decreases with decreasing the luminous intensity ratio Rc. This suggests that the less luminous intensity ratio Rc can reduce the amount of the light leaked to the opposite side of the light-emitting surface (the second surface 104).

The inventors have examined conditions in which the luminous intensity ratio Rmax is equal to or less than 2%, based the results of FIGS. 8 and 9. Studies of the inventors have revealed that when the luminous intensity ratio Rmax is equal to or less than 2%, the amount of the light leaked to the opposite side of the light-emitting surface (the second surface 104) is sufficiently reduced. That is, the allowable value of the luminous intensity ratio Rmax can be regarded to be 2%.

In the example illustrated in FIG. 9, the relation between the luminous intensity ratio Rc and the maximum luminous intensity ratio Rmax may be approximated as Rmax=5Rc+ 0.2. With this result, when the luminous intensity ratio Rc is equal to or less than 0.36, the maximum luminous intensity ratio Rmax is equal to or less than 2%. In other words, when the light distribution of each of the light emitting elements 140 has luminous intensity in the critical-angle direction of the substrate 100 and the medium that is equal to or less than 0.36 times the luminous intensity in the front direction of the light emitting element 140, it is possible to sufficiently reduce the amount of the light leaked to the opposite side of the light-emitting surface (the second surface 104). Here, the light emitting element 140 of which the luminous intensity ratio Rc is equal to or less than 0.36 is a light emitting element having greater multiplier in $\cos \theta$ than that of the light emitting element 140 following $\cos^4 \theta$. In other words, the light emitting element 140 of which the luminous intensity ratio Rc is equal to or less than 0.36 is a light emitting element having a half-value angle equal to or less than 66 degrees.

Figure 10:
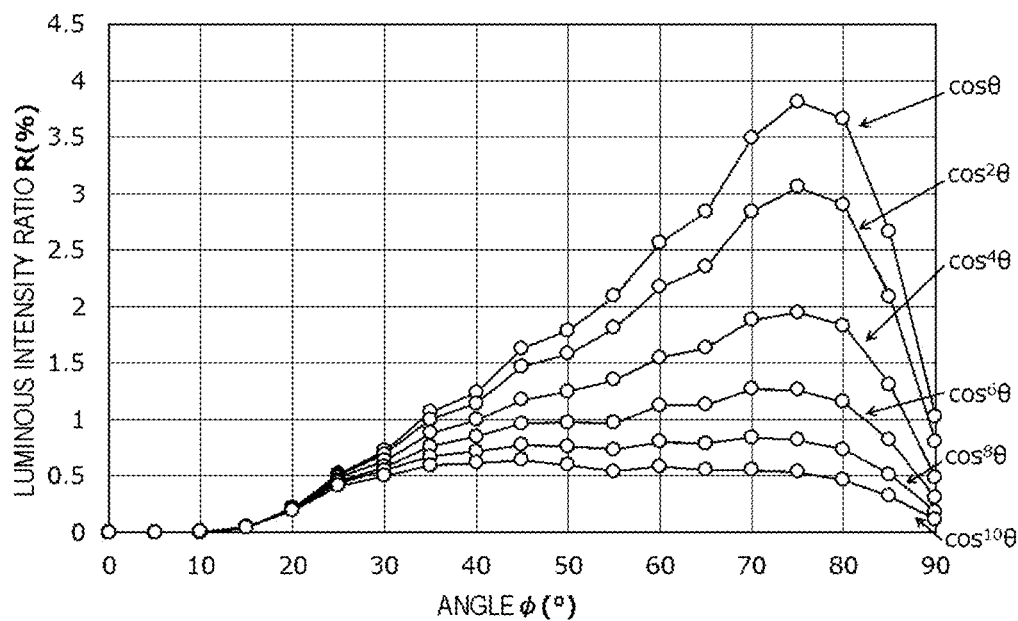
FIG. 10 is a diagram illustrating a second example of the simulation result of the amount of the light leaked to the opposite side of the light-emitting surface of the light emitting device.

FIG. 10 is a diagram illustrating a second example of the simulation result of the amount of the light leaked to the opposite side of light-emitting surface of the light emitting device 10 (the second surface 104 of substrate 100). The second example illustrated in FIG. 10 was similar to the first example illustrated in FIG. 8 except that the substrate 100 was made of polyethylene terephthalate (PET) (refractive index: 1.6).

As illustrated in FIG. 10, from $\cos \theta$ to $\cos^{10} \theta$, the luminous intensity ratio R decreases over the almost entire range of 0° to 90° for the angle φ. In other words, as the luminous intensity ratio Rc of the critical-angle luminous intensity Ic to the front luminous intensity If is reduced, the amount of light leaked to the opposite side of the light-emitting surface of the light emitting device 10 (the second surface 104 of the substrate 100) decreases over the almost entire range of 0° to 90° for the angle φ. In the example illustrated in FIG. 10, the critical angle of the substrate 100 and the medium is 38.68°.

Figure 11:
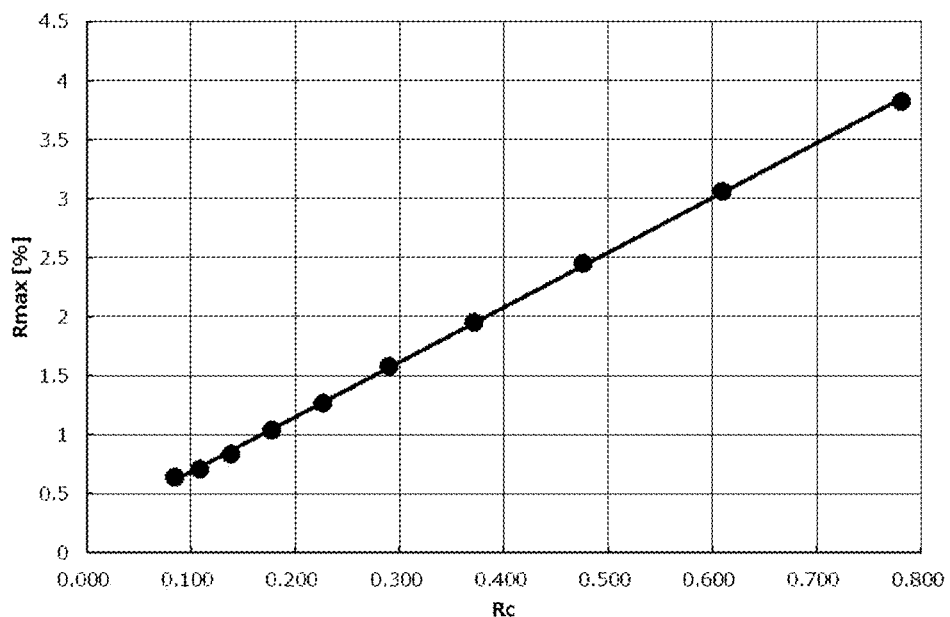
FIG. 11 is a graph illustrating a relation between the luminous intensity ratio of the critical-angle luminous intensity to the front luminous intensity and the maximum value of the luminous intensity ratio illustrated in FIG. 10.

FIG. 11 is a graph illustrating a relation between the luminous intensity ratio Rc of the critical-angle luminous intensity Ic to the front luminous intensity If and the maximum value Rmax of the luminous intensity ratio R illustrated in FIG. 10. As illustrated in FIG. 11, the maximum luminous intensity ratio Rmax decreases as the luminous intensity ratio Rc decreases. This suggests that the less luminous intensity ratio Rc can reduce the amount of the light leaked to the opposite side of the light-emitting surface (the second surface 104).

In the example illustrated in FIG. 11, the relation between the luminous intensity ratio Rc and the maximum luminous intensity ratio Rmax may be approximated as Rmax=5Rc+0.2. With this result, when the luminous intensity ratio Rc is equal to or less than 0.36, the maximum luminous intensity ratio Rmax is equal to or less than 2%. In other words, when the light distribution of each of the light emitting elements 140 has luminous intensity in the critical-angle direction of the substrate 100 and the medium that is equal to or less than 0.36 times the luminous intensity in the front direction of the light emitting element 140, it is possible to sufficiently reduce the amount of the light leaked to the opposite side of the light-emitting surface (the second surface 104).

In all of the first example illustrated in FIGS. 8 and 9 and the second example illustrated in FIGS. 10 and 11, when the light distribution of each of the light emitting elements 140 has luminous intensity in the critical-angle direction of the substrate 100 and the medium that is equal to or less than 0.36 times the luminous intensity in the front direction of the light emitting element 140, it is possible to sufficiently reduce the amount of the light leaked to the opposite side of the light-emitting surface (the second surface 104). This suggests that the amount of light leaked to the opposite side of the light-emitting surface of the light emitting device 10 (the second surface 104 of the substrate 100) can be reduced without depending on the material of the substrate 100, by adjusting the light distribution of each of the light emitting elements 140.

Figure 12:
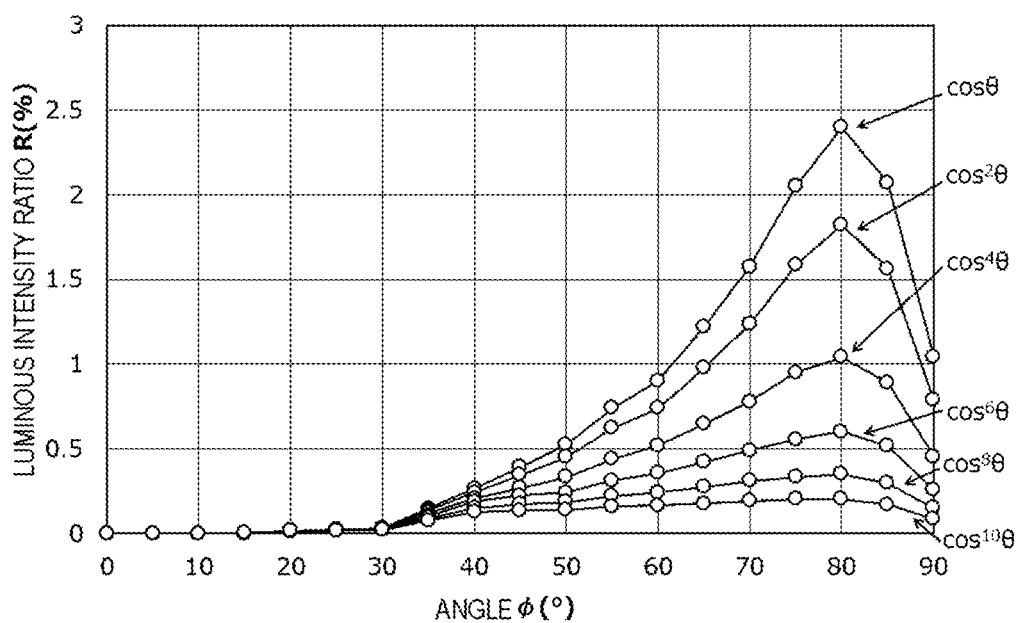
FIG. 12 is a diagram illustrating a third example of the simulation result of the amount of the light leaked to the opposite side of the light-emitting surface of the light emitting device.

FIG. 12 is a diagram illustrating a third example of the simulation result of the amount of the light leaked to the opposite side of light-emitting surface of the light emitting device 10 (the second surface 104 of the substrate 100). The third example illustrated in FIG. 12 is similar to the first example illustrated in FIG. 8 except that the thickness T of the substrate 100 is 0.05 mm. In other words, the thickness T (0.05 mm) of the substrate 100 in the example illustrated in FIG. 12 is thinner than the thickness T (0.1 mm) of the substrate 100 in the example illustrated in FIG. 8.

As illustrated in FIG. 12, from $\cos \theta$ to $\cos^{10} \theta$, the luminous intensity ratio R decreases over the almost entire range of 0° to 90° for the angle φ. In other words, as the luminous intensity ratio Rc of the critical-angle luminous intensity Ic to the front luminous intensity If is reduced, the amount of light leaked to the opposite side of the light-emitting surface of the light emitting device 10 (the second surface 104 of the substrate 100) decreases over the almost entire range of 0° to 90° for the angle φ.

Regarding all of $\cos \theta$ to $\cos^{10} \theta$, the luminous intensity ratio R in FIG. 12 is less than the luminous intensity ratio R in FIG. 8 (the reason that the luminous intensity ratio R is reduced as the thickness T of the substrate 100 becomes thinner will be described later with reference to FIG. 14). Therefore, the luminous intensity ratio Rc required to achieve the maximum luminous intensity ratio Rmax of 2% or less in FIG. 12 may be greater than the luminous intensity ratio Rc (0.36) required to achieve the maximum luminous intensity ratio Rmax of 2% or less in FIG. 8. Therefore, in FIG. 12, when the light distribution of each of the light emitting elements 140 has luminous intensity in the critical-angle direction of the substrate 100 and the medium that is equal to or less than 0.36 times the luminous intensity in the front direction of the light emitting element 140, it is possible to sufficiently reduce the amount of the light leaked to the opposite side of the light-emitting surface (the second surface 104).

Figure 13:
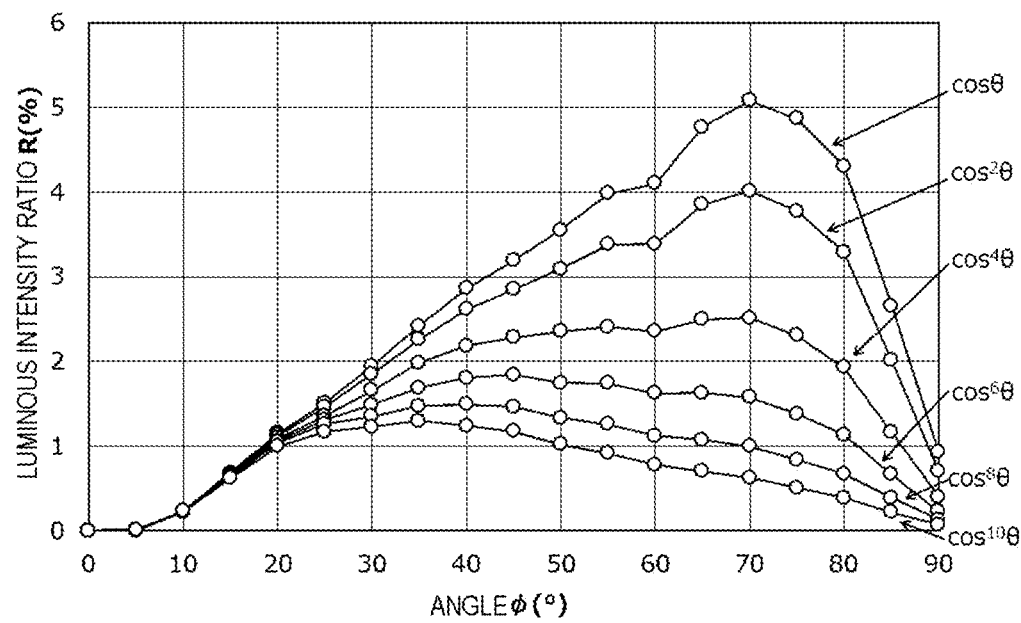
FIG. 13 is a diagram illustrating a fourth example of the simulation result of the amount of the light leaked to the opposite side of the light-emitting surface of the light emitting device.

FIG. 13 is a diagram illustrating a fourth example of the simulation result of the amount of the light leaked to the opposite side of light-emitting surface of the light emitting device 10 (the second surface 104 of the substrate 100). The fourth example illustrated in FIG. 13 is similar to the first example illustrated in FIG. 8 except that the thickness T of the substrate 100 is 0.2 mm. In other words, the thickness T (0.2 mm) of the substrate 100 in the example illustrated in FIG. 13 is thicker than the thickness T (0.1 mm) of the substrate 100 in the example illustrated in FIG. 8.

As illustrated in FIG. 13, from $\cos \theta$ to $\cos^{10} \theta$, the luminous intensity ratio R decreases over the almost entire range of 0° to 90° for the angle cp. In other words, as the luminous intensity ratio Rc of the critical-angle luminous intensity Ic to the front luminous intensity If is reduced, the amount of light leaked to the opposite side of the light-emitting surface of the light emitting device 10 (the second surface 104 of the substrate 100) decreases over the almost entire range of 0° to 90° for the angle φ.

Regarding all of $\cos \theta$ to $\cos^{10} \theta$, the luminous intensity ratio R in FIG. 13 is greater than the luminous intensity ratio R in FIG. 8 (the reason that the luminous intensity ratio R increases as the thickness T of the substrate 100 becomes thicker will be described later with reference to FIG. 14). Therefore, the luminous intensity ratio Rc required to achieve the maximum luminous intensity ratio Rmax of 2% or less in FIG. 13 needs to be less than the luminous intensity ratio Rc (0.36) required to achieve the maximum luminous intensity ratio Rmax of 2% or less in FIG. 8. Specifically, the inventors have examined the condition in which the maximum luminous intensity ratio Rmax is equal to or less than 2%, in a manner similar to the method described with reference to FIGS. 9 and 11. As a result, it has been revealed that the light distribution of each of the light emitting elements 140 needs to have luminous intensity in the critical-angle direction of the substrate 100 and the medium that is equal to or less than 0.20 times luminous intensity in the front direction of the light emitting element 140.

Figure 14A:
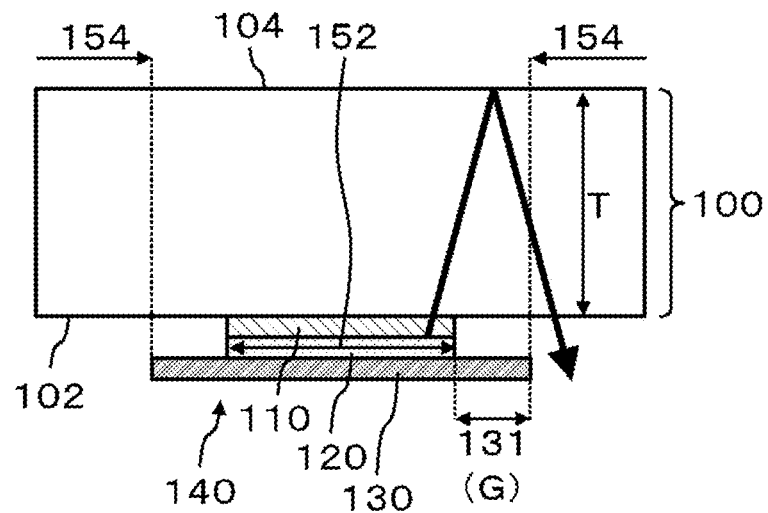
FIGS. 14A and 14B are diagrams for explaining a reason that the amount of the light leaked to the opposite side of the light-emitting surface of the light emitting device is changed depending on a thickness of a substrate.
Figure 14B:
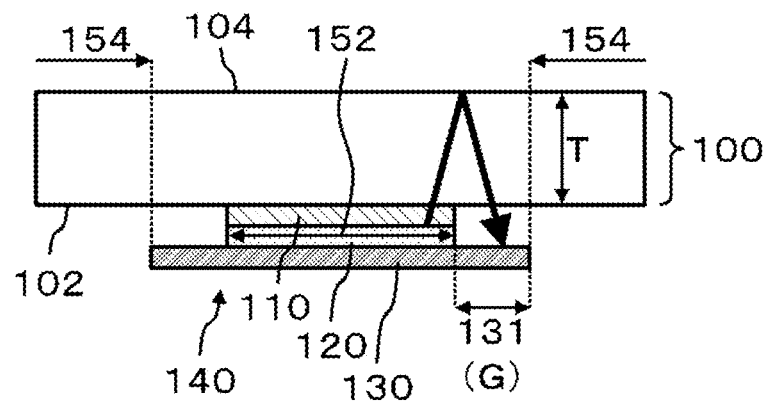

FIG. 14 is a diagram for explaining a reason of changing the amount of the light leaked to the opposite side of the light-emitting surface of the light emitting device 10 (the second surface 104 of the substrate 100), depending on the thickness T of the substrate 100. In all the example illustrated in FIG. 14(a) and the example illustrated in FIG. 14(b), light is emitted from the same position of the light emitting portion 152 in the same direction. The example illustrated in FIG. 14(a) is common with the example illustrated in FIG. 14(b) except that the thickness T of the substrate 100 in FIG. 14(b) is thinner than the thickness T of the substrate 100 in FIG. 14(a).

As illustrated in both FIGS. 14(a) and 14(b), light emitted from the light emitting portion 152 may be reflected by the second surface 104 of the substrate 100 due to Fresnel reflection. In the example illustrated in FIG. 14(a), the thickness T of the substrate 100 is thick. Therefore, the light reflected by the second surface 104 of the substrate 100 is leaked to the opposite side of the second surface 104 of the substrate 100. On the other hand, in the example illustrated in FIG. 14(b), the thickness T of the substrate 100 is thin. Therefore, the light reflected by the second surface 104 of the substrate 100 is blocked by the gap portion 131, and thus is not leaked to the opposite side of the second surface 104 of the substrate 100. With such a configuration, the luminous intensity ratio R is reduced as the thickness T of the substrate 100 becomes thinner, and the luminous intensity ratio R increases as the thickness T of the substrate 100 becomes thicker.

Figure 15:
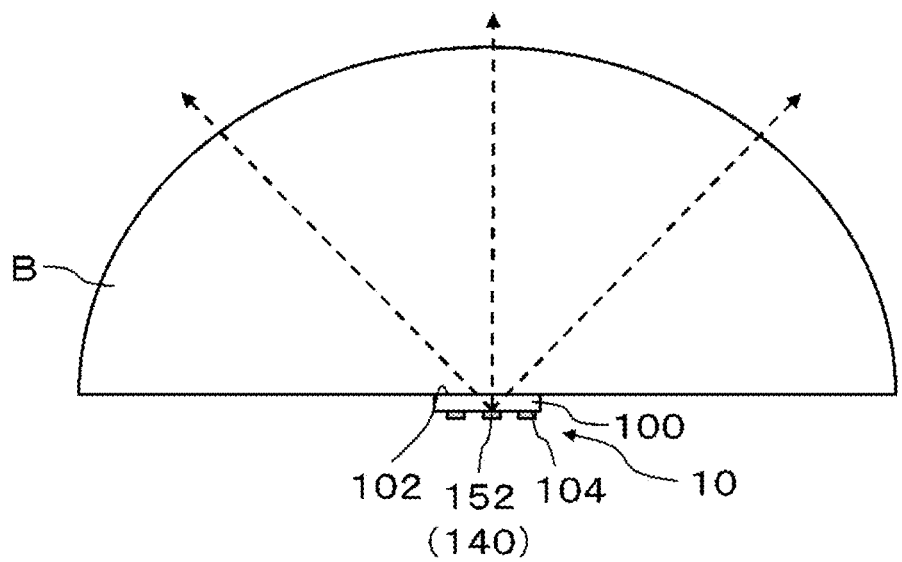
FIG. 15 is a diagram for explaining a first example of a method of measuring the light distribution of the light emitting element.

FIG. 15 is a diagram for explaining a first example of a method of measuring the light distribution of the light emitting element 140.

In the example illustrated in FIG. 15, the light distribution is measured by using the base material B. The refractive index of the base material B is equal to the refractive index of the substrate 100. The shape of the base material B is hemispherical or semi-cylindrical. The center of the light emitting device 10 is positioned on the center of the base material B. Particularly in the example illustrated in FIG. 15, the size of the base material B is sufficiently larger than the size of the light emitting device 10. Thus, all the plurality of light emitting elements 140 can be regarded to be positioned on the center of the base material B.

In the example illustrated in FIG. 15, all the plurality of light emitting portions 152 emit light. As described above, all the plurality of light emitting portions 152 (plurality of light emitting elements 140) can be regarded to be positioned on the center of the base material B. Thus, the light emitted from the plurality of light emitting portions 152 is not refracted by the spherical or cylindrical surface of the base material B, but is emitted from the spherical or cylindrical surface of the base material B. Accordingly, the light distribution of the light emitting element 140 can be measured by measuring the light emitted from the spherical or cylindrical surface of the base material B.

Figure 16:
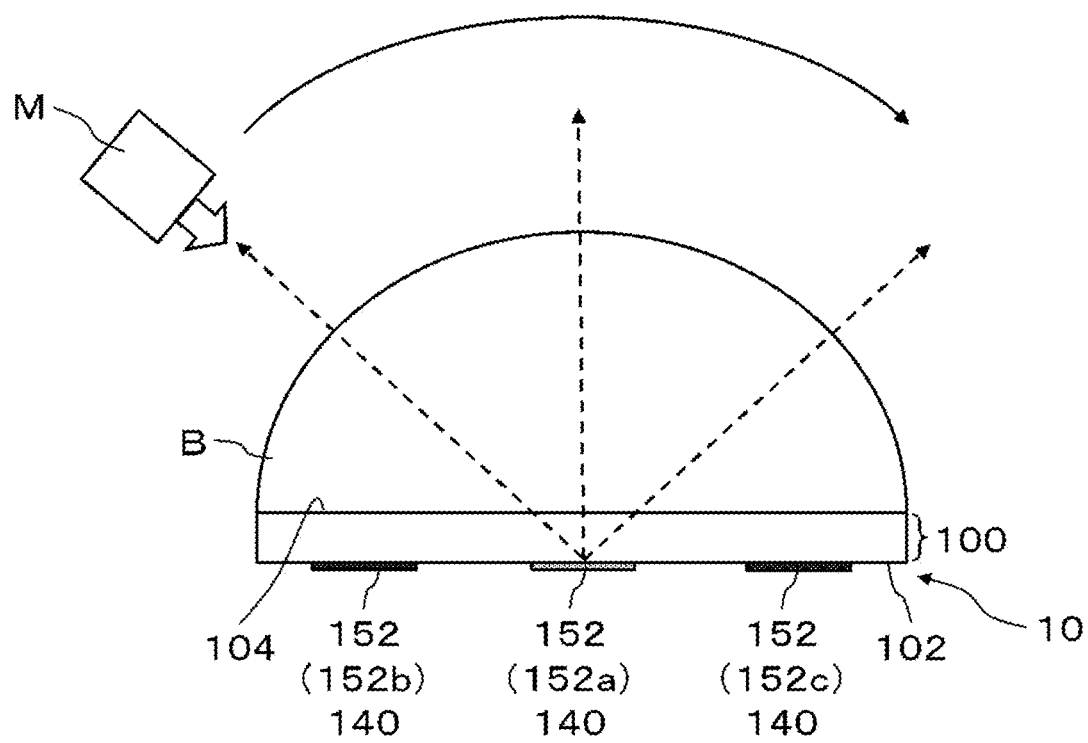
FIG. 16 is a diagram for explaining a second example of the method of measuring the light distribution of the light emitting element.

FIG. 16 is a diagram for explaining a second example of the method of measuring the light distribution of the light emitting element 140.

In the example illustrated in FIG. 16, the light distribution is measured by using the base material B. The refractive index of the base material B is equal to the refractive index of the substrate 100. The shape of the base material B is hemispherical or semi-cylindrical. The center of the light emitting device 10 is positioned on the center of the base material B. Particularly in the example illustrated in FIG. 16, a light emitting portion 152a of the plurality of light emitting portions 152 in the light emitting device 10 is positioned on the center of the base material B.

In the example illustrated in FIG. 16, the light emitting portion 152a emits light. Light emitting portions other than the light emitting portion 152a, that is, alight emitting portion 152b and light emitting portion 152c do not emit light. The light emitting portion 152b and the light emitting portion 152c can be set not to emit light by not flowing a current in the light emitting portion 152b and the light emitting portion 152c, or light-shielding the light emitting portion 152b and the light emitting portion 152c. As described above, the light emitting portion 152a is positioned on the center of the base material B. Thus, the light emitted from the light emitting portion 152a is not refracted by the spherical or cylindrical surface of the base material B, but is emitted from the spherical or cylindrical surface of the base material B. Accordingly, the light distribution of the light emitting element 140 (light emitting portion 152a) can be measured by measuring the light emitted from the spherical or cylindrical surface of the base material B. In the example illustrated in FIG. 16, the light emitted from the spherical or cylindrical surface of the base material B is measured by using a measuring instrument M.

As described above, according to the embodiment, it is possible to reduce the amount of light leaked to the opposite side of the light-emitting surface of the light emitting device 10 (the second surface 104 of the substrate 100).

In all FIGS. 8, 10, 12, and 13, the light distribution at the second surface 104 side in the light emitting device 10 may have luminous intensity in the direction perpendicular to the second surface 104 (angle $\varphi=0°$) that is less than the luminous intensity in the direction inclined from the direction perpendicular to the second surface 104 (angle $\varphi>0°$. In a general use of the light emitting device 10, the light emitting device 10 is viewed from the front of the second surface 104 in many cases. The light emitting device 10 itself may be inclined from a horizontal direction in some use. In this case, as a response, the peak of the emission luminous intensity on the second surface 104 of the light emitting device 10 may be in a direction inclined from the direction perpendicular to the second surface 104 (angle $\varphi>0°$).

EXAMPLE

Figure 17:
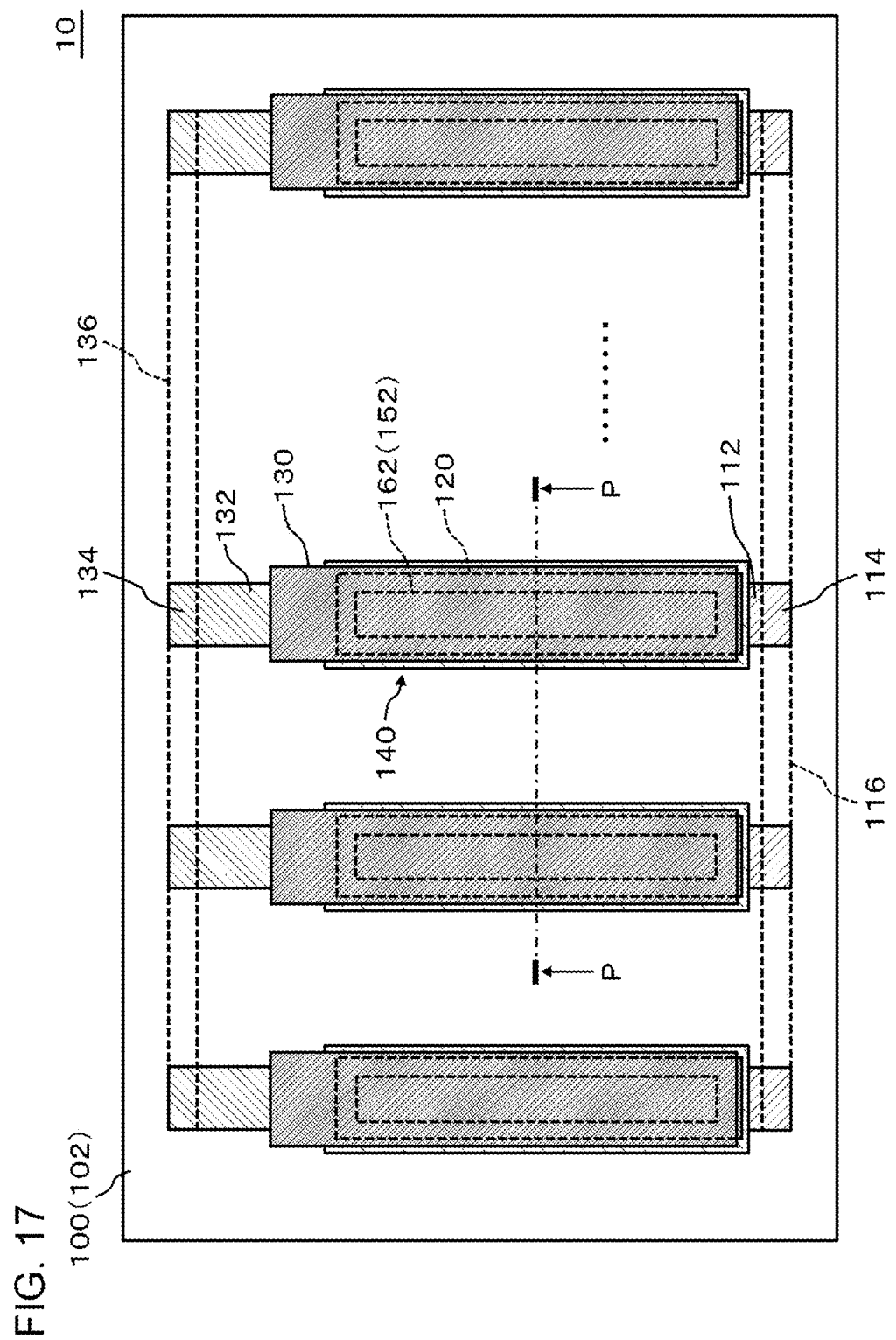
FIG. 17 is a plan view illustrating a light emitting device according to an example.
Figure 18:
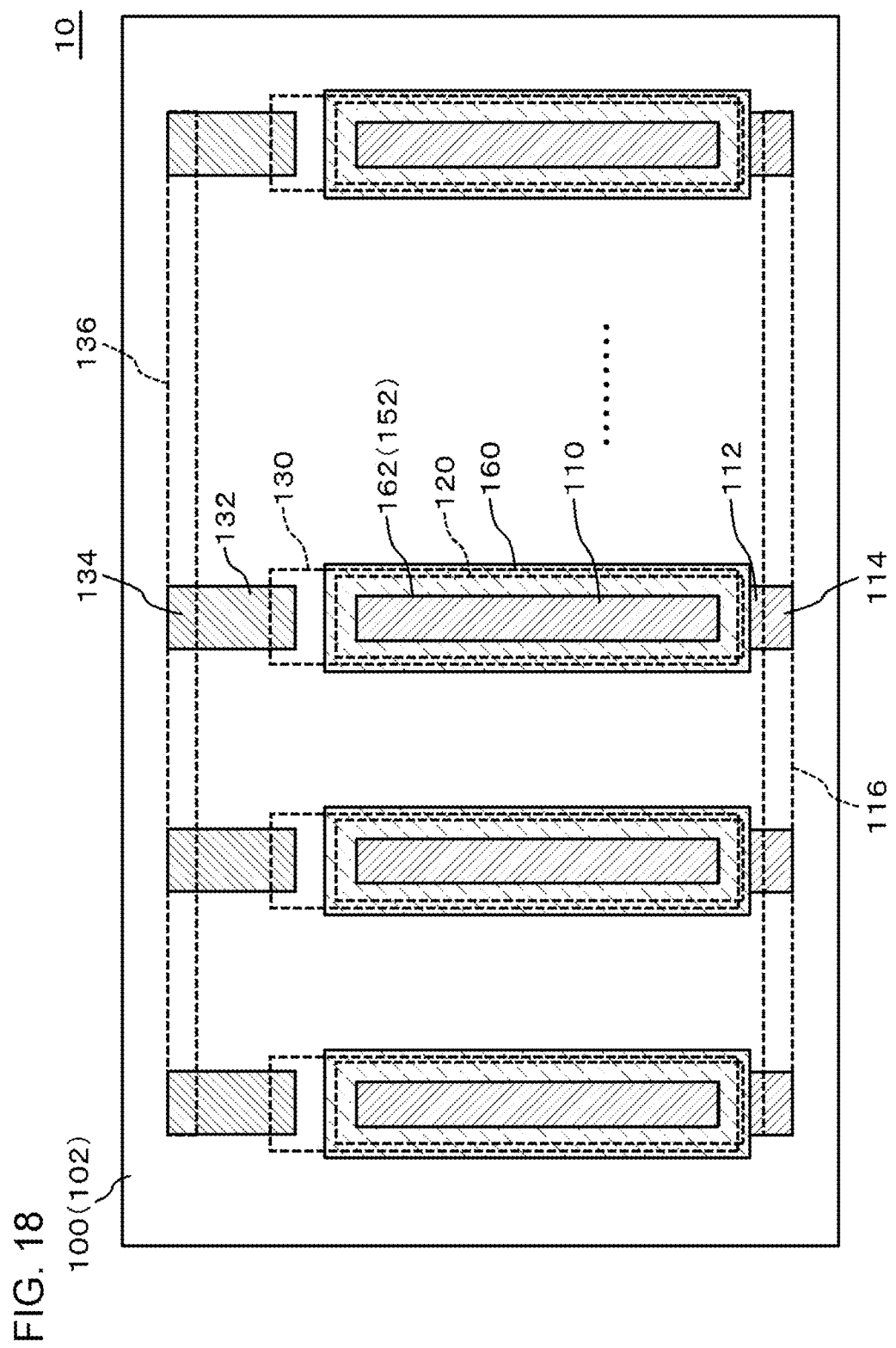
FIG. 18 is a diagram with an organic layer and a second electrode removed from FIG. 17.
Figure 19:
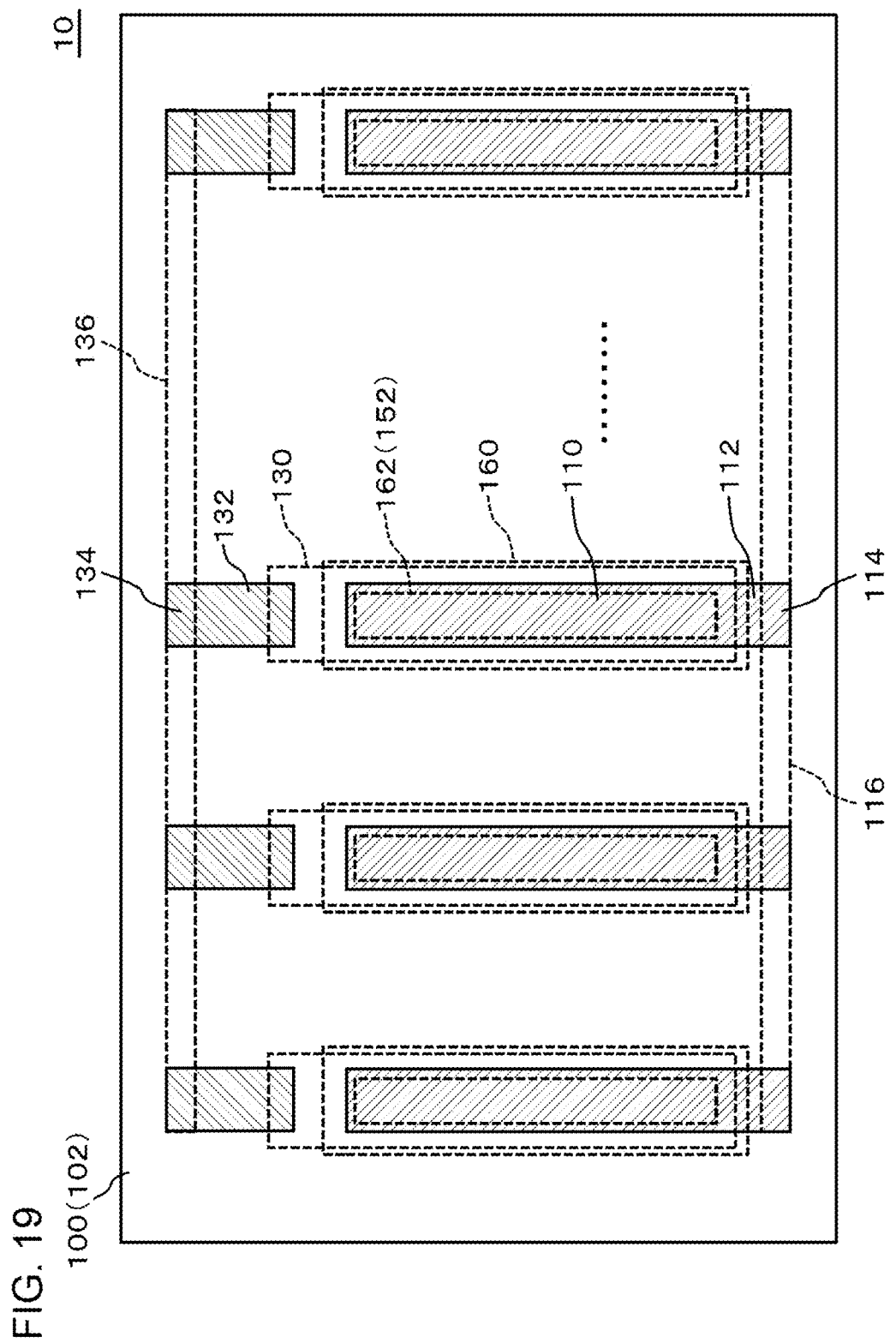
FIG. 19 is a diagram with an insulating layer removed from FIG. 18.
Figure 20:
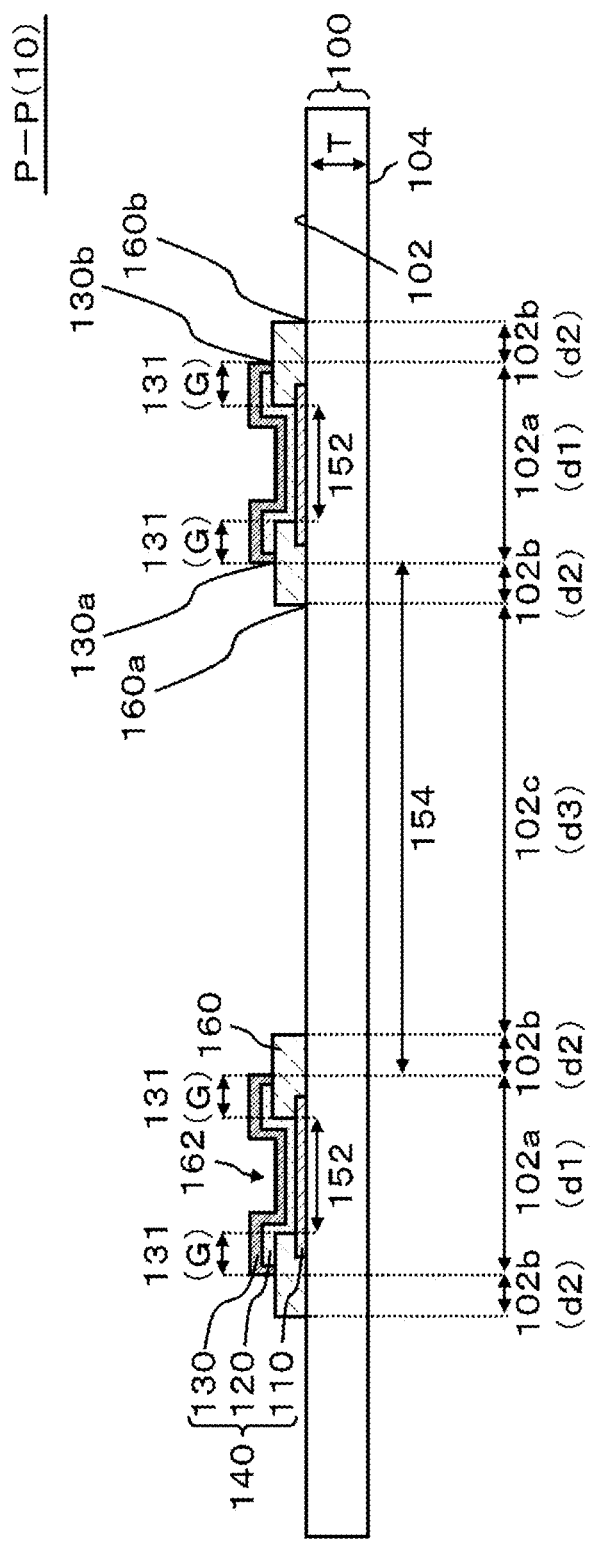
FIG. 20 is a sectional view taken along line P-P in FIG. 17.

FIG. 17 is a plan view illustrating the light emitting device 10 according to an example. FIG. 18 is a diagram with the organic layer 120 and the second electrode 130 removed from FIG. 17. FIG. 19 is a diagram with an insulating layer 160 removed from FIG. 18. FIG. 20 is a sectional view taken along line P-P in FIG. 17.

The outline of the light emitting device 10 will be described with reference to FIG. 20. Similar to Embodiment 3, the light emitting device 10 includes the substrate 100, the plurality of light emitting elements 140, and the plurality of light transmission portions 154. The substrate 100 has a first surface 102 and a second surface 104. The second surface 104 is opposite to the first surface 102. The plurality of light emitting elements 140 is positioned at the first surface 102 side of the substrate 100. Each of the plurality of light emitting elements 140 includes a first electrode 110, an organic layer 120, and a second electrode 130. The second electrode 130 has a light shielding property. Each of the plurality of light transmission portions 154 is positioned between adjacent light emitting elements 140. In a manner similar to Embodiment 3, it is possible to reduce the amount of light leaked to the opposite side of the light-emitting surface (the second surface 104 of the substrate 100) by adjusting the light distribution of each of the light emitting elements 140.

Next, details of a planar layout of the light emitting device 10 will be described with reference to FIGS. 17 to 19. The light emitting device 10 includes the substrate 100, a plurality of first connection portions 112, a first wiring 114, a plurality of second connection portions 132, a second wiring 134, a plurality of light emitting elements 140, and a plurality of insulating layers 160. Each of the plurality of light emitting elements 140 includes a first electrode 110, an organic layer 120, and a second electrode 130.

As viewed from a direction perpendicular to the first surface 102, the shape of the substrate 100 is a rectangle having a pair of long sides and a pair of short sides. The shape of the substrate 100 is not limited to a rectangle. As viewed from a direction perpendicular to the first surface 102, the shape of the substrate 100 may be, for example, a circle or a polygon other than a rectangle.

The plurality of first electrodes 110 is positioned to be spaced from each other. Specifically, the plurality of first electrodes 110 is arranged in one line, along the long side of the substrate 100. Each of the plurality of first electrodes 110 extends along the short side of the substrate 100.

Each of the plurality of first electrodes 110 is connected to the first wiring 114 via each of the plurality of first connection portions 112. The first wiring 114 extends along one of the pair of the long sides of the substrate 100. A voltage from the outside of the device is supplied to the first electrode 110 via the first wiring 114 and the first connection portion 112. In the example illustrated in FIG. 19, the first electrode 110 and the first connection portion 112 are integrated. In other words, the light emitting device 10 includes a conductive layer having a region functioning as the first electrode 110 and a region functioning as the first connection portion 112.

Each of the plurality of second electrodes 130 overlaps each of the plurality of first electrodes 110. The plurality of second electrodes 130 is positioned to be spaced from each other. Specifically, the plurality of second electrodes 130 is arranged in one line, along the long side of the substrate 100. Each of the plurality of second electrodes 130 extends along the short side of the substrate 100. Specifically, each of the plurality of second electrodes 130 has a pair of long sides extending along the short side of the substrate 100 and a pair of short sides extending along the long side of the substrate 100.

Each of the plurality of second electrodes 130 is connected to the second wiring 134 via each of the plurality of second connection portions 132. The second wiring 134 extends along the other of the pair of the long sides of the substrate 100. A voltage from the outside of the device is supplied to the second electrode 130 via the second wiring 134 and the second connection portion 132.

Each of the plurality of insulating layers 160 overlaps each of the plurality of first electrodes 110. The plurality of insulating layers 160 is positioned to be spaced from each other. Specifically, the plurality of insulating layers 160 is arranged in one line, along the long side of the substrate 100. Each of the plurality of insulating layers 160 extends along the short side of the substrate 100. Specifically, each of the plurality of insulating layers 160 has a pair of long sides extending along the short side of the substrate 100 and a pair of short sides extending along the long side of the substrate 100.

Each of the plurality of insulating layers 160 has an opening 162. As will be described later with reference to FIG. 20, in the opening 162, the light emitting element 140 has a region functioning as the light emitting portion 152. In other words, the insulating layer 160 defines the light emitting portion 152. The light emitting portion 152 (the opening 162) extends along the short side of the substrate 100. Specifically, the light emitting portion 152 (the opening 162) has a pair of long sides extending along the short side of the substrate 100 and a pair of short sides extending along the long side of the substrate 100.

Next, details of a section of the light emitting device 10 will be described with reference to FIG. 20. The light emitting device 10 includes the substrate 100, the light emitting element 140, and the insulating layer 160. The substrate 100 has a first surface 102 and a second surface 104. The second surface 104 is opposite to the first surface 102. The light emitting element 140 includes the first electrode 110, the organic layer 120, and the second electrode 130. The light emitting element 140 and the insulating layer 160 are on the first surface 102 of the substrate 100. In the opening 162 of the insulating layer 160, the light emitting element 140 has a region functioning as the light emitting portion 152.

The substrate 100 is light-transmissive. In one example, the substrate 100 contains glass. In another example, the substrate 100 may contain resin.

The first electrode 110 is light-transmissive and conductivity. Specifically, the first electrode 110 contains a light-transmissive and conductive material, such as metal oxide, for example, specifically at least one of indium tin oxide (ITO) and indium zinc oxide (IZO), for example. Thus, light from the organic layer 120 can be transmitted through the first electrode 110.

The organic layer 120 includes a hole injection layer, a hole transporting layer, a light emitting layer, an electron transporting layer, and an electron injection layer, for example. The hole injection layer and the hole transporting layer are connected to the first electrode 110. The electron transporting layer and the electron injection layer are connected to the second electrode 130. The light emitting layer emits light by a voltage between the first electrode 110 and the second electrode 130.

In the example, the second electrode 130 has the light shielding property or light reflectivity, and further has conductivity. Specifically, the second electrode 130 contains a material having light reflectivity and conductivity, such as metal, for example, specifically, at least one of Al, Ag, and MgAg, for example. Thus, light from the organic layer 120 is hardly transmitted through the second electrode 130 but is reflected by the second electrode 130.

The second electrode 130 has two gap portions 131. One gap portion 131 is outside one end portion of the light emitting portion 152. The other gap portion 131 is outside the other end portion of the light emitting portion 152.

The insulating layer 160 is light-transmissive. In one example, the insulating layer 160 contains an organic insulating material, such as specifically polyimide, for example.

In another example, the insulating layer 160 may contain an inorganic insulating material, such as specifically silicon oxide ($SiO_x$), silicon oxynitride (SiON), or silicon nitride ($SiN_x$), for example.

The second electrode 130 has an end portion 130a and an end portion 130b. The insulating layer 160 has an end portion 160a and an end portion 160b. The end portion 130a and the end portion 160a are directed toward the same direction. The end portion 130b and the end portion 160b are directed toward the same direction. The end portion 130b and the end portion 160b are opposite to the end portion 130a and the end portion 160a, respectively.

As viewed from the direction perpendicular to the first surface 102, the first surface 102 of the substrate 100 has a plurality of regions 102a, a plurality of regions 102b, and a plurality of regions 102c. Each of the plurality of regions 102a spreads from a position overlapping the end portion 130a of the second electrode 130 to a position overlapping the end portion 130b thereof. Each of the plurality of regions 102b spreads from a position overlapping the end portion 130a of the second electrode 130 to a position overlapping the end portion 160a of the insulating layer 160 (or from a position overlapping the end portion 130b of the second electrode 130 to a position overlapping the end portion 160b of the insulating layer 160). Each of the plurality of regions 102c spreads from a position overlapping the end portion 160a of one of two adjacent insulating layers 160 to a position overlapping the end portion 160b of the other insulating layer 160.

The region 102a overlaps the second electrode 130. Therefore, the light emitting device 10 has the lowest light transmittance in a region overlapping the region 102a among the regions which overlap the region 102a, the region 102b, and the region 102c. The region 102c does not overlap any of the second electrode 130 and the insulating layer 160. Therefore, the light emitting device 10 has the highest light transmittance in a region overlapping the region 102c among the regions which overlap the region 102a, the region 102b, and the region 102c. The region 102b does not overlap the second electrode 130 but overlaps the insulating layer 160. Therefore, the light emitting device 10 has light transmittance in the region overlapping the region 102b that is higher than light transmittance in the region overlapping the region 102a and that is lower than light transmittance in the region overlapping the region 102c.

In the above-described configuration, the light transmittance is high over the entirety of the light emitting device 10. In detail, the width of the region having high light transmittance, that is, the width d3 of the region 102c becomes wide. Specifically, the width d3 of the region 102c is wider than the width d2 of the region 102b (d3>d2). With such a configuration, the light transmittance over the entirety of the light emitting device 10 becomes high.

In the above-described configuration, the light emitting device 10 is prevented from largely absorbing light having a specific wavelength. In detail, the width of a region in which light is transmitted through the insulating layer 160, that is, the width d2 of the region 102b becomes narrow. Specifically, the width d2 of the region 102b is narrower than the width d3 of the region 102c (d2<d3). The insulating layer 160 may absorb light having a specific wavelength. In such a case, in the above-described configuration, it is also possible to reduce the amount of light transmitted through the insulating layer 160. This prevents the light emitting device 10 from largely absorbing light having a specific wavelength.

The width d3 of the region 102c may be wider than the width d1 of the region 102a (d3>d1), be narrower than the width d1 of the region 102a (d3<d1), or be equal to the width d1 of the region 102a (d3=d1).

In one example, a ratio d2/d1 of the width d2 of the region 102b to the width d1 of the region 102a is equal to or greater than 0 and equal to or less than 0.2 (0≤d2/d1≤0.2). A ratio d3/d1 of the width d3 of the region 102c to the width d1 of the region 102a is equal to or greater than 0.3 and equal to or less than 2 (0.3≤d3/d1≤2). More specifically, in one example, the width d1 of the region 102a is equal to or greater than 50 μm and equal to or less than 500 μm. The width d2 of the region 102b is equal to or greater than 0 μm and equal to or less than 100 μm. The width d3 of the region 102c is equal to or greater than 15 μm and equal to or less than 1000 μm.

The light emitting device 10 functions as a semi-transparent OLED. Specifically, a region not overlapping the second electrode 130 functions as a light transmission portion 154. With such a configuration, in the light emitting device 10, the plurality of light emitting portions 152 and a plurality of light transmission portions 154 are alternately arrayed. When light is not emitted from the plurality of light emitting portions 152, human vision perceives that an object at the first surface 102 side is seen through from the second surface 104 side, and an object at the second surface 104 side is seen through from the first surface 102 side. Further, light from the plurality of light emitting portions 152 is mainly output from the second surface 104 side, but is hardly output from the first surface 102 side. When light is emitted from the plurality of light emitting portions 152, human vision perceives that an object at the second surface 104 side is seen through from the first surface 102 side.

In one example, the light emitting device 10 can be used as a high mount stop lamp of an automobile. In this case, the light emitting device 10 can be attached to a rear window of the automobile. Further, in this case, the light emitting device 10 emits red light, for example.

Next, a method of manufacturing the light emitting device 10 illustrated in FIGS. 17 to 20 will be described.

Firstly, the first electrode 110, the first connection portion 112, and the second connection portion 132 are formed on the first surface 102 of the substrate 100. In one example, the first electrode 110, the first connection portion 112, and the second connection portion 132 are formed by patterning a sputter-formed conductive layer.

Then, the insulating layer 160 is formed. In one example, the insulating layer 160 is formed by patterning photosensitive resin applied onto the first surface 102 of the substrate 100.

Then, the organic layer 120 is formed. In one example, the organic layer 120 is formed by evaporation. In another example, the organic layer 120 may be formed by application. In this case, a material of the organic layer 120 is applied inside the opening 162 of the insulating layer 160.

Then, the second electrode 130 is formed. In one example, the second electrode 130 is formed by vacuum evaporation with a mask.

In such a manner, the light emitting device 10 illustrated in FIGS. 17 to 20 is manufactured.

Figure 21:
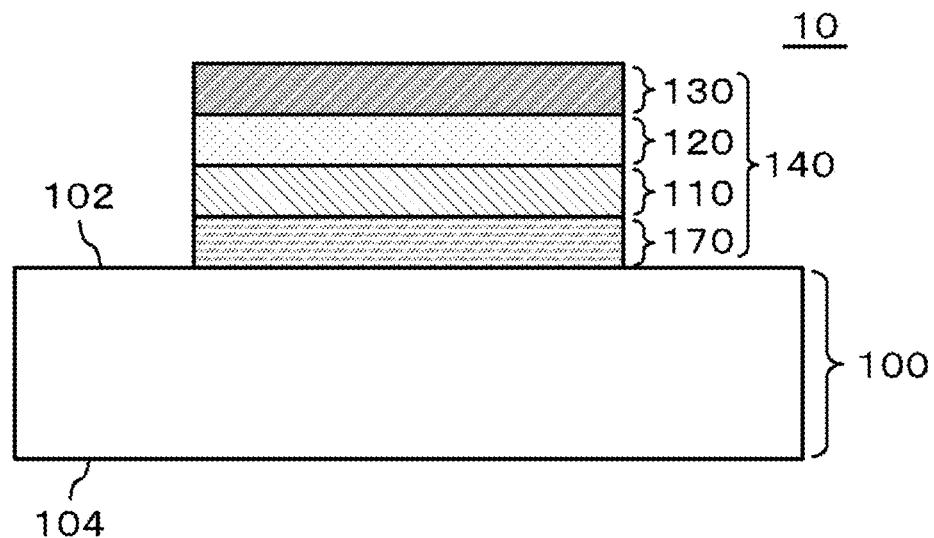
FIG. 21 is a diagram illustrating a first example of a structure of reducing the luminous intensity ratio of the critical-angle luminous intensity to the front luminous intensity.

FIG. 21 is a diagram illustrating a first example of a structure of reducing the luminous intensity ratio Rc of the critical-angle luminous intensity Ic to the front luminous intensity If.

The light emitting element 140 includes the first electrode 110, the organic layer 120, the second electrode 130, and a semi-transparent reflecting layer 170. The second electrode 130 functions as a reflective layer. With such a configuration, the light emitting element 140 has a resonator structure (microcavity). Specifically, light emitted from the organic layer 120 is reflected between the second electrode (reflective layer) 130 and the semi-transparent reflecting layer 170 and then is output from the semi-transparent reflecting layer 170. In such a microcavity, the light distribution of the light emitting element 140 has a steep peak in the front direction of the light emitting element 140. Thus, it is possible to reduce the luminous intensity ratio Rc of the critical-angle luminous intensity lc to the front luminous intensity lf.

In one example, the semi-transparent reflecting layer 170 includes a plurality of laminated dielectric films. Such a plurality of dielectric films can function as a half mirror, that is, the semi-transparent reflecting layer 170. In another example, the semi-transparent reflecting layer 170 may be a metal thin film (for example, Ag thin film). In this example, the thickness of the metal thin film is thin, and thus a portion of light can be transmitted through the metal thin film. Therefore, the metal thin film can function as a half mirror, that is, the semi-transparent reflecting layer 170.

Figure 22:
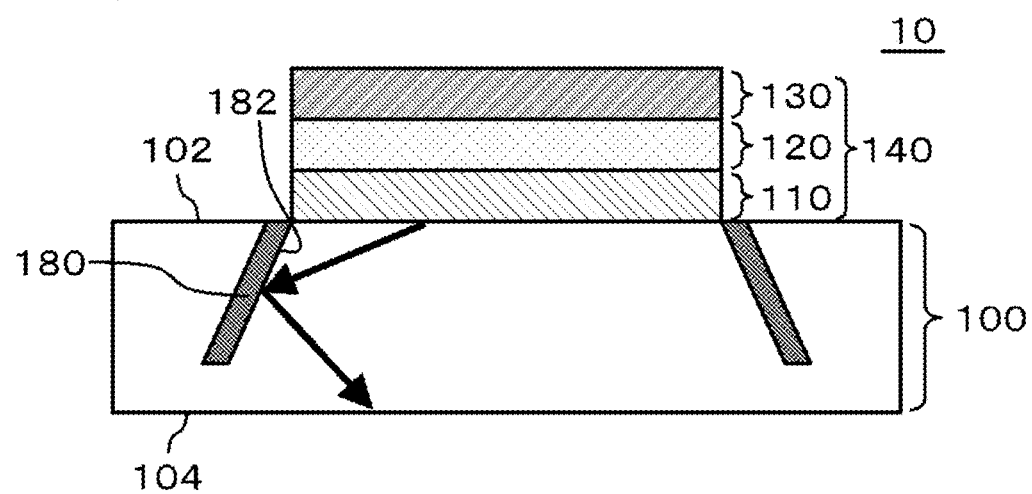
FIG. 22 is a diagram illustrating a second example of the structure of reducing the luminous intensity ratio of the critical-angle luminous intensity to the front luminous intensity.

FIG. 22 is a diagram illustrating a second example of the structure of reducing the luminous intensity ratio Rc of the critical-angle luminous intensity lc to the front luminous intensity lf.

The light emitting device 10 has a reflection portion 180. The reflection portion 180 is positioned between the light emitting element 140 and the second surface 104 of the substrate 100. Particularly in the example illustrated in FIG. 22, the reflection portion 180 is buried in the substrate 100. The reflection portion 180 has a reflective surface 182. The reflective surface 182 is inclined outwardly relative to the light emitting element 140 toward the second surface 104 side.

In the example illustrated in FIG. 22, light emitted from the light emitting element 140 is reflected by the reflective surface 182 of the reflection portion 180. Since the reflective surface 182 is inclined outwardly relative to the light emitting element 140 toward the second surface 104 side, an inclination of an optical axis to the direction perpendicular to the second surface 104 can become gentle after light is reflected by the reflective surface 182, in comparison to that before the light is reflected by the reflective surface 182. Therefore, it is possible to reduce the amount of light incident to the second surface 104 at a large incident angle. Accordingly, it is possible to reduce the luminous intensity ratio Rc of the critical-angle luminous intensity lc to the front luminous intensity lf.

According to this example, similar to the embodiments, it is possible to reduce the amount of light leaked to the opposite side of the light-emitting surface of the light emitting device 10 (the second surface 104 of the substrate 100).

Other Examples

Other examples will be described below. In the other example, the second electrode 130 may be light-transmissive. In this case, the second electrode 130 can be achieved by the material of the above-described first electrode 110 or a film thickness of 100 nm or less of the material of the above-described second electrode. With such a configuration, the light emitting device 10 can be high light-transmissive over the entirety thereof. With such a configuration, the surface of main light emission may be the first surface 102 side of the substrate 100.

In this case, however, emitted light does not pass through the substrate 100. Thus, it is necessary that light distribution in the second electrode 130 of the light source satisfies characteristics similar to the example (luminous intensity at a critical angle to the front is equal to or less than 0.36 times) at a critical angle of the second electrode 130 and the low-refractive-index medium at the first surface 102 side of the substrate 100 from which it is finally emitted. This reduces Fresnel reflection on a surface at a light emission surface side of the electrode 130, and can prevent leakage of main emitted light to the second surface 104 side of the substrate 100.

In this case, light extracted through the second electrode 130 of the light emitting element 140 can be prevented from being reflected or scattered due to sealing or the like, and from being extracted out to the second surface 104 side through the substrate 100.

According to other examples, in a manner similar to that in the example, it is possible to emit and divide light into main emitted light and sub-emitted light by the light emitting device 10 while maintaining high transmittance as the light emitting device 10. That is, it is possible to reduce the amount of the sub-emitted light, in other words, the amount of light leaked to the opposite side of the light-emitting surface (the second surface 104 or first surface 102 of the substrate 100). Particularly when the light emitting device 10 is used as a display device such as a display, there is a problem of a main light emission side on which display contents of the light emitting device 10 are recognizable and a sub-light emission side on which the display contents are unrecognizable by reversing the left and the right. Since light emission intensity to the sub-light emission side, however, can be reduced, strange feeling can be reduced.

Hitherto, the embodiment and examples are described with reference to the drawings. The embodiment and examples are just examples, and various configurations other than the above-described configurations can be employed.

Hereinafter, an example of a reference embodiment will be added.

1. A light emitting device including:

a substrate including a first surface and a second surface opposite to the first surface;

a plurality of light emitting elements positioned at the first surface side of the substrate, each of the light emitting elements including a first electrode, an organic layer, and a second electrode; and a plurality of light transmission portions each positioned between adjacent light emitting elements, in which a medium having a refractive index lower than that of the substrate is positioned at the second surface side of the substrate, and light distribution of each of the light emitting elements has luminous intensity in a critical-angle direction of the substrate and the medium that is equal to or less than 0.36 times luminous intensity in a direction perpendicular to the substrate.

2. The light emitting device described in 1, in which each of the light emitting elements has a resonator structure.

3. The light emitting device described in 2, in which the resonator structure includes a plurality of laminated dielectric films.

4. The light emitting device described in 1 further including a reflection portion positioned between the light emitting element and the second surface of the substrate, and reflecting light emitted from the light emitting element, and in which the reflection portion includes a reflective surface inclined outwardly relative to the light emitting element toward the second surface side.

5. The light emitting device described in any of 1 to 4, in which light distribution at the second surface side has luminous intensity in a direction perpendicular to the second surface that is less than luminous intensity in a direction inclined from a direction perpendicular to the second surface.

6. The light emitting device described in any of 1 to 5, in which the second electrode has a light shielding property.

7. A light emitting device including:

a substrate including a first surface and a second surface opposite to the first surface;

a plurality of light emitting elements positioned at the first surface side of the substrate, each of the light emitting elements including a first electrode, an organic layer, and a second electrode having a light shielding property; and a plurality of light transmission portions each positioned between adjacent light emitting elements, in which the second surface of the substrate is positioned at a side of a medium having a refractive index lower than that of the substrate, and light distribution at the second surface side has luminous intensity in a direction perpendicular to the second surface that is less than luminous intensity in a direction inclined from a direction perpendicular to the second surface.

8. A light emitting device including:

a substrate including a first surface and a second surface opposite to the first surface;

a plurality of light emitting elements positioned at the first surface side of the substrate, each of the light emitting elements including a first electrode, an organic layer, and a second electrode, and a plurality of light transmission portions each positioned between adjacent light emitting elements, in which a directivity half-value angle of light emission of each of the light emitting elements is equal to or less than 66 degrees.

9. The light emitting device described in 8, in which the maximum value of emission luminous intensity at the first surface side is equal to or less than 2% of the maximum value of emission luminous intensity at the second surface side.

10. The light emitting device described in 8 or 9, in which each of the light emitting elements has a resonator structure.

11. The light emitting device described in 10, in which the resonator structure includes a plurality of laminated dielectric films.

12. The light emitting device described in 8 or 9 further including a reflection portion positioned between the light emitting element and the second surface of the substrate, and reflecting light emitted from the light emitting element, in which the reflection portion includes a reflective surface inclined outwardly relative to the light emitting element toward the second surface side.

13. The light emitting device described in any of 7 to 12, in which the second electrode has a light shielding property.

This application claims priority based on Japanese Patent Application No. 2017-006774 filed on Jan. 18, 2017, the disclosure of which is incorporated herein in its entirety.

The invention claimed is:

1. An optical device comprising:
a light emitting device comprising:
    a substrate comprising a first surface and a second surface opposite to the first surface;
    a plurality of light emitting elements positioned at the first surface side of the substrate, each of the light emitting elements comprising a first electrode, an organic layer, and a second electrode having at least one of a light shielding property, a light reflectivity, and a light absorbency; and
    a plurality of light transmission portions each positioned between adjacent the second electrodes of the light emitting elements; and
a light receiving element, the light receiving element positioned at one of (i) a first position adjacent to the first surface of the substrate opposite the second surface of the substrate along a direction perpendicular to the first surface, (ii) a second position adjacent to the first surface of the substrate opposite the second surface of the substrate and diagonally offset from the direction perpendicular to the first surface, and (iii) a third position at a side of the substrate between the first surface and the second surface of the substrate,
wherein the second surface of the substrate faces a medium opposite the first surface of the substrate, the substrate having a refractive index higher than that of the medium, and
wherein luminous intensity of light distribution of each of the light emitting elements in a critical-angle direction for total internal reflection of light incident at an interface between the second surface of the substrate and the medium is equal to or less than 0.36 times luminous intensity of the light distribution of each of the light emitting elements in a direction perpendicular to the substrate.

2. The optical device according to claim 1,
wherein each of the light emitting elements has a resonator structure.

3. The optical device according to claim 2,
wherein the resonator structure comprises a plurality of laminated dielectric films.

4. The optical device according to claim 1, further comprising
a reflection portion positioned between the light emitting element and the second surface of the substrate, and reflecting light emitted from the light emitting element,
wherein the reflection portion comprises a reflective surface inclined outwardly relative to the light emitting element toward the second surface side.

5. The optical device according to claim 1,
wherein light distribution at the second surface side has luminous intensity in a direction perpendicular to the second surface that is less than, luminous intensity in a direction inclined from a direction perpendicular to the second surface.

6. The optical device according to claim 1,
wherein the second electrode has a light shielding property.

7. An optical device comprising:
a light emitting device comprising:
    a substrate comprising a first surface and a second surface opposite to the first surface;

a plurality of light emitting elements positioned at the first surface side of the substrate, each of the light emitting elements comprising a first electrode, an organic layer, and a second electrode having at least one of a light shielding property, a light reflectivity, and a light absorbency, and a plurality of light transmission portions each positioned between adjacent the second electrodes of the light emitting elements; and a light receiving element, the light receiving element positioned at one of (i) a first position adjacent to the first surface of the substrate opposite the second surface of the substrate along a direction perpendicular to the first surface, (ii) a second position adjacent to the first surface of the substrate opposite the second surface of the substrate and diagonally offset from the direction perpendicular to the first surface, and (iii) a third position at a side of the substrate between the first surface and the second surface of the substrate, wherein the second surface of the substrate faces a medium opposite the first surface of the substrate, the substrate having a refractive index higher than that of the medium, and wherein luminous intensity of light distribution at the second surface side opposite the first surface in a direction perpendicular to the second surface is less than luminous intensity of the light distribution at the second surface side opposite the first surface in a direction inclined from the direction perpendicular to the second surface.

8. An optical device comprising:
a light emitting device comprising:
  a substrate comprising a first surface and a second surface opposite to the first surface;
  a plurality of light emitting elements positioned at the first surface side of the substrate, each of the light emitting elements comprising a first electrode, an organic layer, and a second electrode having at least one of a light shielding property, a light reflectivity, and a light absorbency; and
  a plurality of light transmission portions each positioned between adjacent the second electrodes of the light emitting elements; and
  a light receiving element the light receiving element positioned at one of (i) a first position adjacent to the first surface of the substrate opposite the second surface of the substrate along a direction perpendicular to the first surface, (ii) a second position adjacent to the first surface of the substrate opposite the second surface of the substrate and diagonally offset from the direction perpendicular to the first surface, and (iii) a third position at a side of the substrate between the first surface and the second surface of the substrate,
wherein a full width at half maximum of light distribution of each of the light emitting elements is equal to or less than 66 degrees.

9. The optical device according to claim 8,
wherein a maximum value of emission luminous intensity at the first surface side is equal to or less than 2% of a maximum value of emission luminous intensity at the second surface side.

10. The optical device according to claim 8,
wherein each of the light emitting elements has a resonator structure.

11. The optical device according to claim 10,
wherein the resonator structure includes a plurality of laminated dielectric films.

12. The optical device according to claim 8, further comprising
a reflection portion positioned between the light emitting element and the second surface of the substrate, and reflecting light emitted from the light emitting element,
wherein the reflection portion comprises a reflective surface inclined outwardly, relative to the light emitting element toward the second surface side.

13. The optical device according to claim 7,
wherein the second electrode has a light shielding property.

14. The optical device according to claim 1, further comprising:
a range sensor comprising the light receiving element.

15. The optical device according to claim 1, further comprising:
an imaging sensor comprising the light receiving element.

* * * * *